United States Patent
Akai et al.

(10) Patent No.: US 12,246,398 B2
(45) Date of Patent: Mar. 11, 2025

(54) SOLDER BUMP FORMING MEMBER, METHOD FOR MANUFACTURING SOLDER BUMP FORMING MEMBER, AND METHOD FOR MANUFACTURING ELECTRODE SUBSTRATE PROVIDED WITH SOLDER BUMP

(71) Applicant: SHOWA DENKO MATERIALS CO., LTD., Tokyo (JP)

(72) Inventors: Kunihiko Akai, Tokyo (JP); Masayuki Miyaji, Tokyo (JP); Junichi Kakehata, Tokyo (JP); Yoshinori Ejiri, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 50 days.

(21) Appl. No.: 17/788,527

(22) PCT Filed: Dec. 15, 2020

(86) PCT No.: PCT/JP2020/046763
§ 371 (c)(1),
(2) Date: Jun. 23, 2022

(87) PCT Pub. No.: WO2021/131905
PCT Pub. Date: Jul. 1, 2021

(65) Prior Publication Data
US 2023/0042727 A1    Feb. 9, 2023

(30) Foreign Application Priority Data
Dec. 27, 2019  (JP) .................. 2019-238418

(51) Int. Cl.
*B23K 3/00*  (2006.01)
*B23K 1/00*  (2006.01)
(Continued)

(52) U.S. Cl.
CPC ............ *B23K 3/087* (2013.01); *B23K 1/0016* (2013.01); *B23K 2101/36* (2018.08)

(58) Field of Classification Search
CPC .................. B23K 3/087; B23K 1/0016; B23K 2101/36–42; H01L 24/17; H01L 24/11;
(Continued)

(56) References Cited

U.S. PATENT DOCUMENTS 5,643,831 A * 7/1997 Ochiai ................. H05K 3/3485
                                                         228/248.1
5,846,366 A    12/1998 Jin et al.
(Continued)

FOREIGN PATENT DOCUMENTS

CN        104465424 A  *  3/2015
EP         1074844 A2  *  2/2001 ........... G01R 1/0441
(Continued)

OTHER PUBLICATIONS

Machine translation of JP 201929135A (no date available).*
International Search Report issued Mar. 9, 2021 in International Application No. PCT/JP2020/046763.

*Primary Examiner* — Kiley S Stoner
(74) *Attorney, Agent, or Firm* — Wenderoth, Lind & Ponack, L.L.P.

(57) ABSTRACT

A solder bump forming member including: a base substrate having a plurality of recesses; and solder particles in the recesses, in which the solder particle has an average particle diameter of 1 to 35 μm and a C.V. value of 20% or less, and a part of the solder particle projects from the recess, or in cross-sectional view, when a depth of the recess is designated as $H_1$, and a height of the solder particle is designated as $H_2$, $H_1 < H_2$ is established.

8 Claims, 9 Drawing Sheets

(51) Int. Cl.
*B23K 3/08* (2006.01)
*B23K 101/36* (2006.01)

(58) Field of Classification Search
CPC ... H01L 24/742; H01L 24/81; H01L 21/4853; H05K 3/3489; H05K 2203/0338; H05K 2203/041; H05K 3/3478; H05K 2203/0113; H05K 2203/0425
USPC ............. 228/39, 56.3, 180.22, 245–246; 257/737–738; 438/612–616
See application file for complete search history.

(56) References Cited

U.S. PATENT DOCUMENTS

| | | | | |
|---|---|---|---|---|
| 6,025,258 | A * | 2/2000 | Ochiai | H01L 24/11 257/E21.508 |
| 6,245,595 | B1 * | 6/2001 | Nguyen | H01L 24/94 257/E21.503 |
| 6,656,750 | B1 * | 12/2003 | Datta | H01L 24/11 257/E23.021 |
| 6,660,944 | B1 * | 12/2003 | Murata | H01L 21/4853 174/250 |
| 7,156,361 | B1 * | 1/2007 | Akram | H05K 3/3485 249/115 |

FOREIGN PATENT DOCUMENTS

| | | | | |
|---|---|---|---|---|
| JP | 5-235061 | | 2/1993 | |
| JP | 7-249631 | | 9/1995 | |
| JP | H07249631 | A * | 9/1995 | |
| JP | H0927568 | A * | 1/1997 | |
| JP | H0927676 | A * | 1/1997 | |
| JP | 10-79404 | | 3/1998 | |
| JP | 2004-80024 | | 3/2004 | |
| JP | 2005-175336 | | 6/2005 | |
| JP | 2010-36234 | | 2/2010 | |
| JP | 2016-131242 | | 7/2016 | |
| JP | 2017-157626 | | 9/2017 | |
| JP | 2019029135 | A * | 2/2019 | |
| KR | 10-2011-0115173 | | 10/2011 | |
| KR | 101408730 | B1 * | 6/2014 | |
| TW | 202006750 | A * | 2/2020 | ............... B22F 1/00 |
| WO | 2006/043377 | | 4/2006 | |
| WO | WO-2015091673 | A1 * | 6/2015 | ......... H01L 21/4882 |
| WO | WO-2016114293 | A1 * | 7/2016 | ............ H01L 24/03 |
| WO | 2019/124512 | | 6/2019 | |
| WO | WO-2020004510 | A1 * | 1/2020 | ............... B22F 1/00 |
| WO | WO-2020004511 | A1 * | 1/2020 | ............ B22F 1/0011 |
| WO | WO-2020004512 | A1 * | 1/2020 | |
| WO | WO-2020004513 | A1 * | 1/2020 | ............... B22F 1/00 |

* cited by examiner

SOLDER BUMP FORMING MEMBER, METHOD FOR MANUFACTURING SOLDER BUMP FORMING MEMBER, AND METHOD FOR MANUFACTURING ELECTRODE SUBSTRATE PROVIDED WITH SOLDER BUMP

TECHNICAL FIELD

The present invention relates to a solder bump forming member, a method for manufacturing a solder bump forming member, and a method for manufacturing an electrode substrate provided with solder bumps.

BACKGROUND ART

A solder ball arrangement sheet has been known, the solder ball arrangement sheet characterized by including: a mask including a plurality of solder ball insertion holes provided with a predetermined. pattern; solder balls accommodated in the insertion holes; and a fixing agent holding the solder balls in the insertion holes see, for example, Patent Literature 1).

A method for manufacturing a solder bump forming sheet has been known, the method including the following steps and holding solder balls or solder powders in predetermined positions (see, for example, Patent Literature 2).

The steps are as follows: A. preparing a sheet having a large number of recesses in predetermined positions on one surface, the bottom surface of the recess being formed of a pressure-sensitive adhesive; B. filling a solder powder in each recess of the sheet to attach and hold the solder powder with the pressure-sensitive adhesive on the recess bottom surface; C. removing a solder powder not held with the pressure-sensitive adhesive from the sheet; and D. coating the solder powder in the recess of the sheet.

A method for forming solder bumps on electrodes has been known, the method including: transferring solder balls disposed in concave grooves to an adhesive roll surface and further transferring the solder balls to pressure-sensitive adhesives on electrodes to form solder bumps on the electrodes (see, for example, Patent Literature 3).

CITATION LIST

Patent Literature

Patent Literature 1: Japanese Unexamined Patent Publication No. 2004-080024
Patent Literature 2: International Publication WO 2006/043377
Patent Literature 3: Japanese Unexamined Patent Publication No. 2017-157626

SUMMARY OF INVENTION

Technical Problem

In the transfer sheet and the manufacturing method described in Patent Literatures 1 and 2, a sticky layer for holding solder particles is required. Therefore, heating is performed to a solder melting point or higher to melt and aggregate the solder, and the sticky layer component is softened, melted, and decomposed by heating at the time of transferring onto the electrode, so that foreign substances may be formed. When the foreign substances are interposed between the solder and the electrode, there is a concern that stable formation of solder bumps is hindered. In a case where these foreign substances are removed after the solder bumps are transferred onto the electrodes, a substrate and a semiconductor package on which an electrode is formed are exposed to a cleaning solution, so that there is a concern that increasing of steps, failures of the base substrate and the semiconductor package, failures due to poor cleaning, and the like occur.

In Patent Literature 3, since solder balls (particles) are disposed on electrodes via a pressure-sensitive adhesive, there is a concern that the pressure-sensitive adhesive component remains on the solder ball surface, and failures occur in bonding. Furthermore, controlling of the thickness of the pressure-sensitive adhesive and irregularities on the pressure-sensitive adhesive surface is tentatively possible in a case where the size of the solder ball is about 100 μm, but this controlling becomes difficult as the size thereof is decreased to 50 μm and 30 μm. Therefore, when solder balls (particles) below 30 are transferred and moved via the pressure-sensitive adhesive, a transfer rate is difficult to increase.

Other than, a transfer sheet has been known in which solder balls (particles) are uniformly disposed on the surface of a base material via a pressure-sensitive adhesive while the solder balls (particles) are in contact with each other. When the solder ball surface of this transfer sheet is pressed against a substrate on which an electrode is formed and then heated, the solder balls are transferred onto the electrodes, and bumps can be formed by reflow thereafter. However, the inventors have conducted studies, and as a result, when a gap between the electrodes becomes narrower, solder is bridged between the electrodes, so that a short circuit failure occurs. Since the solder balls adjacent to each other are in contact with each other, it is speculated that solder is necessarily melted and aggregated by heat at the time of transferring to the electrode, so that a portion straddling between electrodes adjacent to each other is generated. In a solder transfer sheet in which solder particles are uniformly arranged while being in contact with each other in this way, in the case of a gap between electrodes at a several micrometer level, currently, solder bumps are difficult to be formed without short circuit.

The present invention has been made in view of the above circumstances, and an object thereof is to provide a solder bump forming member that is useful in manufacturing a connection structure excellent in both insulation reliability and conduction reliability even when the number of connection places of circuit members to be electrically connected to each other is small, and a manufacturing therefor. Furthermore, another object of the present invention is to provide a method for manufacturing an electrode substrate provided with solder bumps using this member.

Solution to Problem

An aspect of the present invention relates to a solder bump forming member including: a base substrate having a plurality of recesses; and solder particles in the recesses, in which the solder particle has an average particle diameter of 1 to 35 μm and a C.V. value of 20% or less, and a part of the solder particle projects from the recess.

An aspect of the present invention relates to a solder bump forming member including: a base substrate having a plurality of recesses; and solder particles in the recesses, in which the solder particle has an average particle diameter of 1 to 35 μm and a C.V. value of 20% or less, and in cross-sectional view, when a depth of the recess is designated as $H_1$, and a height of the solder particle is designated as $H_2$, $H_1<H_2$ is established.

The solder bump forming member is useful in manufacturing a connection structure excellent in both insulation reliability and conduction reliability even when the number of connection places of circuit members to be electrically connected to each other is small.

In an embodiment of the solder bump forming member, a planar portion may be formed on a part of a surface of the solder particle.

In the embodiment of the solder bump forming member, a distance between the recesses adjacent to each other may be 0.1 times or more the average particle diameter of the solder particle.

An aspect of the present invention relates to a method for manufacturing a solder bump forming member, the method including: a preparing step of preparing a base substrate having a plurality of recesses and solder fine particles; an accommodating step of accommodating at least some of the solder fine particles in the recess; and a fusing step of fusing the solder fine particles accommodated in the recess to form a solder particle in the recess, a part of the solder particle projecting from the recess.

In an embodiment of the method for manufacturing a solder bump forming member, the solder particle may have an average particle diameter of 1 to 35 µm and a C.V. value of 20% or less.

In the embodiment of the method for manufacturing a solder bump forming member, the C.V. value of the solder fine particle may exceed 20%.

The embodiment of the method for manufacturing a solder bump forming member may further include a reducing step of exposing the solder fine particles accommodated in the recess to a reducing atmosphere, before the fusing step.

In the fusing step in the embodiment of the method for manufacturing a solder bump forming member, the solder fine particles may be fused in a reducing atmosphere.

An aspect of the present invention relates to a method for manufacturing an electrode substrate provided with solder bumps, the method including: a preparing step of preparing the above-described solder bump forming member and a substrate having a plurality of electrodes; a disposing step of allowing a surface having the recesses of the solder bump forming member and a surface having the electrodes of the substrate to face each other so as to bring the solder particle and the electrode into contact with each other; and a heating step of heating the solder particle at a temperature equal to or higher than a melting point of the solder particle.

In the heating step in the embodiment of the method for manufacturing an electrode substrate provided with solder bumps, the solder particle may be heated at a temperature equal to or higher than a melting point of the solder particle while bringing the solder particle and the electrode into contact with each other in a pressurized state.

The embodiment of the method for manufacturing an electrode substrate provided with solder humps may further include a reducing step of exposing the solder particle to a reducing atmosphere, before the disposing step.

The embodiment of the method. for manufacturing an electrode substrate provided with solder bumps may further include a reducing step of exposing the solder particle to a reducing atmosphere, after the disposing step and before the heating step.

In the embodiment of the method for manufacturing an electrode substrate provided with solder bumps, in the heating step, the solder particle may be heated at a temperature equal to or higher than a melting point of the solder particle in a reducing atmosphere.

The embodiment of the method for manufacturing an electrode substrate provided with solder bumps may further include a removing step of removing the solder bump forming member from the substrate, after the heating step.

The embodiment of the method for manufacturing an electrode substrate provided with solder bumps may further include a washing step of removing the solder particle not bonded to the electrode, after the removing step.

Advantageous Effects of Invention

According to the present invention, it is possible to provide a solder bump forming member that is useful in manufacturing a connection structure excellent in both insulation reliability and conduction reliability even when the number of connection places of circuit members to be electrically connected to each other is small, and a manufacturing method therefor. Furthermore, according to the present invention, it is possible to provide a method for manufacturing an electrode substrate provided with solder bumps using this member.

DESCRIPTION OF EMBODIMENTS

Hereinafter, embodiments of the present invention will be described. The present invention is not limited to the following embodiments. Note that, materials listed as examples below may be used singly or in combinations of two or more, unless otherwise specifically indicated. When a plurality of substances corresponding to each component exist in the composition, the content of each component in the composition means the total amount of the plurality of substances that exist in the composition, unless otherwise specified. A numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage may be replaced with the upper limit value or the lower limit value of the numerical range of another stage. In the numerical ranges that are described in the present specification, the upper limit value or the lower limit value of the numerical range may be replaced with the value shown in Examples.

<Solder Bump Forming Member>

In an embodiment, a solder bump forming member includes a base substrate having a plurality of recesses, and solder particles in the recesses, in which the solder particle has an average particle diameter of 1 to 35 μm and a C.V. value of 20% or less, and a part of the solder particle projects from the recess. Furthermore, in an embodiment, a. solder bump forming member includes a base substrate having a plurality of recesses, and solder particles in the recesses, in which the solder particle has an average particle diameter of 1 to 35 μm and a C.V. value of 20% or less, and in cross-sectional view, when a depth of the recess is designated as $H_1$, and a height of the solder particle is designated as $H_2$, $H_1<H_2$ is established.

Figure 1:
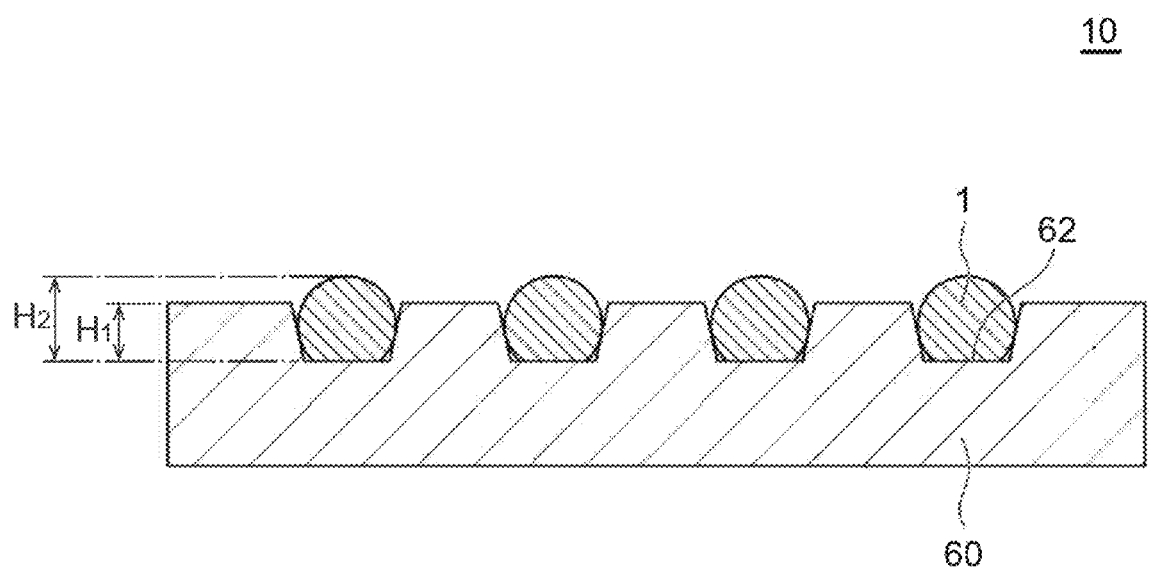
FIG. 1 is a cross-sectional view schematically illustrating a solder bump forming member according to an embodiment.

FIG. 1 is a cross-sectional view schematically illustrating a solder bump forming member according to an embodiment. A solder bump forming member 10 includes a base substrate 60 having a plurality of recesses 62 and solder particles 1 in the recesses 62. In a predetermined longitudinal section of the solder bump forming member 10, one solder particle 1 is disposed to be arranged in a transverse direction (in a right-left direction in FIG. 1) in a state where the one solder particle 1 is spaced apart from another solder particle 1 adjacent thereto. The solder particle 1 may be in contact with a side surface and/or a bottom surface in the recess 62. The solder hump forming member may have a film shape (solder bump forming film), a sheet shape (solder bump forming sheet), or the like.

In the solder bump forming member 10, a part of the solder particle 1 projects from the recess. At least the apex of the solder particle 1 can project from the recess 62 of the solder bump forming member 10 (protrude from the main surface of the base substrate 60). Specifically, in cross-sectional view perpendicular to a main surface of the solder bump forming member 10, when the depth of the recess 62 is designated as $H_1$, and the height of the solder particle 1 is designated as $H_2$, $H_1<H_2$ is established. The height $H_2$ of the solder particle 1 refers to a length from the bottom surface of the recess 62 in cross-sectional view to the apex of the solder particle 1. The degree of projection of the solder particle 1 is not particularly limited, but from the viewpoint of more suitably performing the bonding the solder particle to the electrode, a ratio of $H_2$ to $H_1$ can be set to 1.02 or more and may be 1.07 or more. The upper limit of the ratio may be 3.00 from the viewpoint of suppressing the dropping-off of the solder particle 1.

(Solder Particle)

The average particle diameter of the solder particle 1 is, for example, 35 μm or less, and preferably 30 μm or less, 25 μm or less, 20 μm or less, or 15 μm or less. Furthermore, the average particle diameter of the solder particle 1 is, for example, 1 μm or more, preferably 2 μm or more, more preferably 3 μm or more, and further preferably 5 μm or more.

The average particle diameter of the solder particle 1 can be measured using various methods suitable for sizes, For example, methods such as a dynamic light scattering method, a laser diffraction method, a centrifugal sedimentation method, an electrical sensing zone method, a resonance mass measurement method can be used. Further, a method of measuring a particle size from an image obtained with an optical microscope, an electronic microscope, or the like can be used. Specific examples of a device include a flow-type particle image analyzer, a Microtrac, and a Coulter counter. The average particle diameter of the solder particle 1 can be a projected area equivalent circle diameter (a diameter of a circle having an equal area to the projected area of a particle) when the solder particle 1 is observed from a direction perpendicular to the main surface of the solder bump forming member 10.

The C.V value of the solder particle 1 is preferably 20% or less, more preferably 10% or less, and further preferably 7% or less, from the viewpoint that more excellent conduction reliability and insulation reliability can be realized. Furthermore, the lower limit of the C.V. value of the solder particle 1 is not particularly limited. For example, the C.V. value of the solder particle 1 may be 1% or more or may be 2% or more.

The C.V. value of the solder particle 1 is calculated by multiplying a value, which is obtained by dividing the standard deviation of the particle diameter measured by the aforementioned method by the average particle diameter, by 100.

Figure 2A:
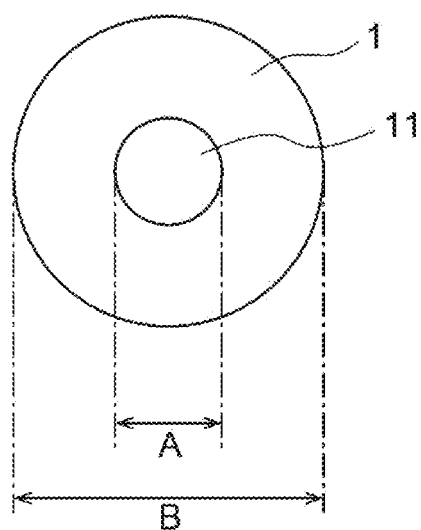
FIG. 2(a) is a view when a solder particle is seen from a side opposite to an opening portion of a recess in FIG. 1.

A planar portion may be formed on a part of a surface of the solder particle. FIG. 2(a) is a view when the solder particle 1 is seen from a side opposite to an opening of the recess 62 in FIG. 1. The solder particle 1 has a shape in which a planar portion 11 having a diameter A is formed on a part of a surface of a sphere having a diameter B. Note that, the solder particle 1 illustrated in FIG. 1 and FIG. 2(a) has the planar portion 11 since the bottom portion of the recess 62 has a planar surface, but in a case where the bottom portion of the recess 62 has a shape other than the planar surface, the solder particle 1 has a surface having a different shape that corresponds to the shape of the bottom portion.

Figure 2B:
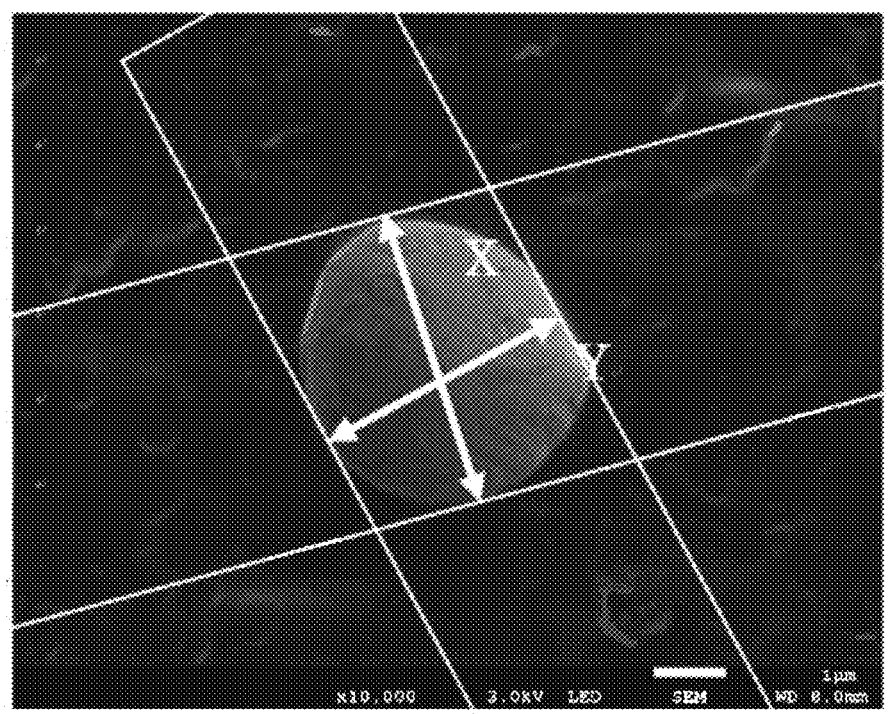
FIG. 2(b) is a view showing distances X and Y (provided that Y<X) between sides facing each other in a case where a quadrangle circumscribing a projection image of the solder particle is created by two pairs of parallel lines.

As illustrated in FIG. 2(a), in the solder particle 1, the planar portion 11 may be formed on a part of the surface, and at this time, a surface other than the planar portion 11 has preferably a spherical cap shape. That is, the solder particle 1 may have the planar portion 11 and a curved surface portion having a spherical cap shape. A ratio (A/B) of a diameter A of the planar portion 11 to a diameter B of the solder particle 1 may be, for example, more than 0.01 and less than 1.0 (0.01<A/B<1.0) or may be 0.1 to 0.9. The planar portion 11 and the bottom surface of the recess 62 may be in contact with each other. As illustrated in FIG. 1, the solder particle 1 has the planar portion 11, and the planar portion and the bottom surface of the recess 62 are in contact with each other, so that extraction of the solder particle 1 from the solder bump forming member 10 is difficult to occur. Note that, as described below, the planar portion may also be generated at a portion at which an inner wall portion of the recess 62 and the solder particle 1 are in contact with each other, In a case where a quadrangle circumscribing a projection image of the solder particle 1 is created by two pairs of parallel lines, when distances X and Y (provided that Y<X) between sides facing each other, a ratio (Y/X) of Y to X may be more than 0.8 and less than 1.0 (0.8<Y/X<1.0), or may be 0.9 or more and less than 1.0. The solder particle 1 as described above can be a particle closer to a perfect sphere. When the solder particle 1 is close to a perfect sphere, there are tendencies that non-uniform contact between the solder particle 1 and the electrode is difficult to occur, and stable connection is obtained. Furthermore, when variation in the volume of the solder particle 1 is small, bonding to the electrode is easily stabilized, FIG. 2(b) is a view showing distances X and Y (provided that Y X) between sides facing each other in a case where a quadrangle circumscribing a projection image of the solder particle is created by two pairs of parallel lines. For example, an arbitrary particle is observed with a scanning electron microscope to obtain a projection image. Two pairs of parallel lines are drawn on the obtained projection image, one pair of parallel lines are disposed at a position at which a distance between the parallel lines is minimized, the other pair of parallel lines are disposed at a position at which a distance between the parallel lines is maximized, and Y/X of the particle is determined. This operation is performed with respect to 300 solder particles, an average value is calculated, and this average value is regarded as Y/X of the solder particle.

The solder particle 1 may contain tin or a tin alloy. As the tin alloy, for example, an In—Sn alloy, an In—Sn—Ag alloy, an Sn—Au alloy, an Sn—Bi alloy, an Sn—Bi—Ag alloy, an Sn—Ag—Cu alloy, an Sn—Cu alloy, and the like can be used. Specific examples of these tin alloys include the following examples.

In—Sn(In 52% by mass, Bi 48% by mass, melting point: 118° C.)
In—Sn—Ag(In 20% by mass, Sn 77.2% by mass, Ag 2.8% by mass, melting point: 175° C.)
Sn—Bi(Sn 43% by mass, Bi 57% by mass, melting point: 138° C.)
Sn—Bi—Ag(Sn 42% by mass, Bi 57% by mass, Ag 1% by mass, melting point: 1139° C.)
Sn—Ag—Cu(Sn 96.5% by mass, Ag 3% by mass, Cu 0.5% by mass, melting point: 217° C.)
Sn—Cu(Sn 99.3% by mass, Cu 0.7% by mass, melting point: 227° C.)
Sn—Au(Sn 21.0% by mass, Au 79.0% by mass, melting point: 278° C.)

The solder particle may contain indium or an indium alloy. As the indium alloy, for example, an In—Bi alloy, an In—Ag alloy, and the like can be used. Specific examples of these indium alloys include the following examples, In—Bi(In 66.3% by mass, Bi 33.7% by mass, melting point: 72° C.)
In—Bi(In 33.0% by mass, Bi 67.0% by mass, melting point: 1109° C.)
In—Ag(In 97.0% by mass, Ag 3.0% by mass, melting point: 145° C.)

The tin alloy or the indium alloy can be selected depending on the use application (temperature at the time of connection) and the like of the solder particle 1. For example, in the case of using the solder particle 1 in fusing at a low-temperature, an In—Sn alloy and an Sn—Bi alloy may be employed, and in this case, the solder particle 1 can be fused at 150° C. or lower. In the case of employing a material having a high melting point such as an Sn—Ag—Cu alloy and an Sn—Cu alloy, high reliability can be maintained even after high-temperature exposure.

The solder particle 1 may contain one or more kinds selected from Ag, Cu, Ni, Bi, Zn, Pd, Pb, Au, P, and B. Among these elements, from the following viewpoints, the solder particle 1 may contain Ag or Cu. That is, when the solder particle 1 contains Ag or Cu, the melting point of the solder particle 1 can be decreased to about 2'20° C., and the bonding strength to the electrode is further improved, so that more favorable conduction reliability is easily obtained.

The Cu content rate of the solder particle 1 is, for example, 0.05 to 10% by mass, and may be 0.1 to 5% by mass or 0.2 to 3% by mass. When the Cu content rate is 0.05% by mass or more, more favorable solder connection reliability is easily achieved. Furthermore, when the Cu content rate is 10% by mass or less, the solder particle 1 having a low melting point and excellent wettability is easily obtained, and as a result, the connection reliability of the bonding part by the solder particle 1 is likely to be favorable.

The Ag content rate of the solder particle 1 is, for example, 0.05 to 10% by mass, and may be 0.1 to 5% by mass or 0.2 to 3% by mass. When the Ag content rate is 0.05% by mass or more, more favorable solder connection reliability is easily achieved. Furthermore, when the Ag content rate is 10% by mass or less, the solder particle 1 having a low melting point and excellent wettability is easily obtained, and as a result, the connection reliability of the bonding part by the solder particle 1 is likely to be favorable.

(Base Substrate)

As a material constituting the base substrate 60, for example, inorganic materials such as silicon, various ceramic materials, glass, a metal such as stainless steel; and organic materials such as various resins can be used. Among these, the base substrate 60 may be formed of a material having heat resistance that is not transformed at a melting temperature of a solder fine particle. Furthermore, the base substrate 60 may be formed of a material having heat resistance that is not transformed even at a temperature at which the solder fine particle is melted. Furthermore, the base substrate 60 may be formed of a material that is not transformed by alloying or reacting with a material constituting the solder fine particle. Furthermore, the recess 62 of the base substrate 60 can be formed by known methods such as a cutting method, a photolithographic method, and an imprint method. In particular, when an imprint method is used, the recess 62 having a precise size can be formed in a short step.

The surface of the base substrate 60 may have a coating layer. From the viewpoint of expanding the selectivity of a material that can be used in the base substrate 60, the coating layer may be formed. of a material that is less likely to be alloyed or is not alloyed with a material. constituting the solder fine particle. As the coating layer, an inorganic matter or an organic matter can be used. As the coating layer, an inorganic matter having a strong oxide layer on a surface such as aluminum or chromium, an oxide such as titanium oxide, a nitride such as boron nitride, a carbon-based material such as diamond-like carbon, diamond, or graphite, a high heat-resistance resin such as a fluororesin or polyimide, and the like can be used. Further, the coating layer may have a role in adjusting wettability with solder. When the coating layer is provided. on the surface of the base substrate 60, wettability with solder can be appropriately adjusted depending on intended use.

As a method for forming the coating layer, lamination, solution dipping, coating, application, impregnation, sputtering, plating, and the like can be used.

From the viewpoint of easily setting conditions of a transferring step, the material for the base substrate 60 may be a material that has a property close to or same as an electrode to which a solder particle is transferred and a substrate on which an electrode is formed. For example, when a material whose coefficient of thermal expansion (CTE) is close or same is used, the positional deviation is less likely to occur when the solder particle is transferred.

An alignment mark may be provided on the base substrate 60. This alignment mark may be read with a camera. There may be an alignment mark also on the substrate side having an electrode. By providing alignment marks of the base substrate 60 and the substrate having an electrode, when the solder particle is transferred onto the electrode, the alignment mark on the base substrate 60 and the alignment mark on the substrate having an electrode are read with a. camera mounted on an apparatus capable of positioning, and the position of the recess 62 having the solder particle and the position of the electrode to which the solder particle is transferred can be accurately grasped. Furthermore, by providing alignment marks of the base substrate 60 and the substrate having an electrode, the solder particle can be transferred onto the electrode with high positional accuracy The number of alignment marks on the base substrate 60 may be one or more. When the number of alignment marks is two or more, positional accuracy is increased.

A specific configuration of the base substrate 60 will be described below (Organic Material Single-Layered)

The base substrate 60 may be constituted by an organic material. The organic material may be a polymer material, and thermoplastic, thermosetting, photocurable materials, and the like can be used. Since the range of choices for physical properties expands by using the organic material, the base substrate 60 suitable for purposes is easily formed. For example, in the case of using the organic material, it is easy to curve or stretch the base substrate 60 (including the recess 62). In the case of using the organic material, various techniques can also be used in the formation of the recess 62. As the formation method of the recess 62, imprinting, photolithography, cutting machining, laser machining, and the like can be used. In particular, according to the imprint method, a mold having a desired shape is pressed against the base substrate 60 made of an organic material, so that an arbitrary shape can be formed on the surface. A convex pattern is formed on the mold and is pressed against the base substrate 60 made of an organic material, so that the recess 62 having a desired pattern can be formed.

Furthermore, a photocurable resin can also be used in the formation of the recess 62, and when a photocurable resin is applied to a mold and the mold is removed after exposure, the base substrate 60 having the recess 62 can be formed. Furthermore, in the case of cutting machining, the recess 62 can be formed with a drill or the like.

(Organic Material Multi-Layered)

Figure 9:
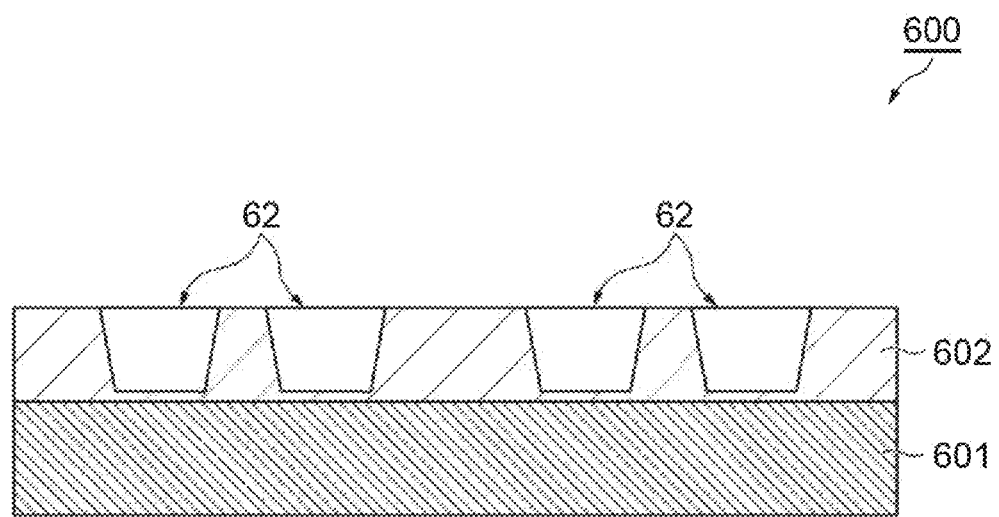
FIG. 9 is a cross-sectional view schematically illustrating an example of the base substrate.

The base substrate may be constituted by a plurality of organic materials. Furthermore, the base substrate may have a plurality of layers, and each of the plurality of layers may be constituted by a different organic material. The organic material may be a polymer material, and thermoplastic, thermosetting, photocurable materials, and the like can be used. The base substrate has two layers constituted by an organic material, and a recess may be formed on one surface side of an organic material layer. By providing multiple layers, as a material for the recess to be in contact with solder, each material can be selected depending on functions, for example, a material suitable for wettability with solder is selected. For example, FIG. 9 is a cross-sectional view schematically illustrating an example of the base substrate. A base substrate 600 includes a base layer 601 and a recess layer 602. The base layer 601 is a layer supporting the recess layer 602 and the recess layer 602 is a layer in which the recess 62 is formed by processing. A resin material excellent in heat resistance and dimension stability is used for the base layer 601, and a material excellent in processability of the recess 62 can be selected for the recess layer 602. For example, a thermoplastic resin such as polyethylene terephthalate or polyimide is used for the base layer 601, and a thermosetting resin with which the recess 62 can be formed using an imprint mold can be used for the recess layer 602. For example, a thermosetting resin is sandwiched between polyethylene terephthalate and an imprint mold and heated and pressurized to obtain the base substrate 600 (including the recess 62) excellent in flatness. Furthermore, in a case where the recess 62 is formed using a photocurable material, a material having high light transparency may be used for the base layer 601. The material having high light transparency may be, for example, polyethylene terephthalate, transparent (colorless type) polyimide, polyamide, and the like, In a case where the recess 62 is formed. using a photocurable material, for example, an appropriate amount of the photocurable material is applied to the surface of an imprint mold, a polyethylene terephthalate film is placed thereon, and the film is irradiated with ultraviolet rays from the side of polyethylene terephthalate while being pressurized with a roller. Then, after the photocurable material is cured, the imprint mold is removed, so that the base substrate 600, which has a polyethylene terephthalate layer and a photocurable material layer and has the recess 62 formed using a photocurable material, can be obtained. The material configurations of the inner wall and the bottom portion of the recess 62 can be changed. For example, the inner wall and the bottom portion of the recess 62 can have a configuration of the same resin material. Furthermore, the inner wall and the bottom portion of the recess 62 can have a configuration of different resin materials (for example, a thermosetting material and a thermoplastic material).

Furthermore, a photosensitive material may be used as the organic material. The photosensitive material may be a positive photosensitive material or a negative photosensitive material. For example, the recess 62 can be easily formed by forming a photosensitive material on a thermoplastic polyethylene terephthalate film surface with a uniform thickness and performing exposure and development. A method using exposure and development (photolithographic method) is widely used in the manufacturing of a semiconductor, a wiring board, and the like, and is a method with high versatility. Furthermore, as the exposure method, other than exposure using a mask, a direct writing method such as direct laser exposure can also be used.

When the material for the base layer 601 is thicker than the thickness of the material forming the recess layer 602, the physical properties of the entire base substrate 600 can become dominant with the properties of the material for the base layer 601. As such, for example, even when there is a weakness in the properties of the material forming the recess layer 602, this weakness can be supplemented with the material for the base layer 601. For example, even when the material forming the recess layer 602 is a material that is easy to be thermally shrunk, a material that is difficult to be thermally shrunk is selected as the material for the base layer 601, and the thickness of the base layer 601 is thicker than the thickness of the material forming the recess layer 602, so that transformation during heating can be suppressed.

Furthermore, an organic material, such as a combination of a resin material excellent in heat resistance or dimension stability and a material in which component elution is less at a melting temperature of the solder fine particle or a combination of a resin material excellent in heat resistance or dimension stability and a material having appropriate wettability with solder, can be appropriately selected depending on purposes.

As described above, the base substrate may be the base substrate 600 including the base layer 601 and the recess layer 602. For example, when the recess layer 602 is formed of a photosensitive material, the recess 62 can be produced by photolithography. When a photocurable or thermosetting material, a thermoplastic material, or the like is used for the recess layer 602, the recess 62 can be easily produced by an imprint method. Furthermore, since the properties of the entire base substrate can also be adjusted by changing the thickness of the base layer 601, there is an advantage that a base substrate also having desired properties can be produced.

(Inorganic Material Single-Layered (Non-Transparent))

The base substrate 60 may be constituted by an inorganic material. From the viewpoint of easily controlling elution of a component and occurrence of foreign substances to be low, for example, as an inorganic material, silicon (silicon wafer), stainless steel, aluminum, and the like can be used. In the case of using these materials in a semiconductor mounting process or the like, countermeasure for contamination is easily made, and this contributes to high yield and stable production. Furthermore, for example, in a case where the solder particle formed in the recess 62 is transferred to the electrode on the silicon wafer, if the base substrate 60 is produced from the silicon wafer, materials whose CTE is close or the same are used. As such, positional deviation, warpage, and the like hardly occur, so that transfer to an accurate position is possible. As the formation method of the recess 62, machining with laser, cutting, or the like, a dry etching or wet etching method, electron beam lithography (for example, FIB machining), and the like can be used. The dry etching is widely used in the production of a semiconductor, MEMS, and the like, and an inorganic material can be processed with high accuracy from micrometer order to nanometer order.

(Inorganic Material Single-Layered (Transparent))

As the base substrate 60, glass, quartz, sapphire, and the like can be used. Since these materials are transparent, when the solder particle in the recess 62 is transferred to another substrate on which an electrode is formed, positioning can be easily performed. As the formation method of the recess 62, machining with laser, cutting, or the like, a dry etching or wet etching method, electron beam lithography (for example, FIB machining), and the like can be used.

An advantage obtained by using an inorganic material is that dimension stability is excellent as compared to an organic material. When the solder particle in the recess 62 is transferred onto the electrode, transfer can be performed with high positional accuracy. For example, in a case where solder particles are transferred to a plurality of electrodes having a micrometer-order size and pitch, when an inorganic material excellent in dimension stability is used, the solder particles can be transferred onto all the electrodes at the same positions.

(Organic-Inorganic Composite Material)

The base substrate may be constituted by a plurality of materials. Furthermore, the base substrate may have a plurality of layers, and each of the plurality of layers may be constituted by a different material. As an organic-inorganic composite material, for example, a combination of an inorganic material and an inorganic material, and a combination of an inorganic material and an organic material can be used. Both the dimension stability and the processability of the recess 62 are achieved with the combination of an inorganic material and an organic material. Examples of a base substrate having the combination of an inorganic material and an organic material include a base substrate including the base layer 601 made of silicon, various ceramic materials, glass, or a metal such as stainless steel that is an inorganic material, and the recess layer 602 made of an organic material. Such a base substrate can be obtained, for example, by a method of forming a film of a photosensitive material on a surface of a silicon wafer and forming a recess by exposure and development. The inner wall and the bottom portion of the recess 62 may be constituted by a photosensitive material, and the inner wall of the recess 62 may be constituted by a photosensitive material and the bottom portion thereof may be constituted by a silicon wafer. The configuration of the recess 62 can be appropriately selected depending on purposes such as wettability with the solder particle in the recess 62 and ease of transfer to the electrode. In a case where the inner wall and the bottom portion of the recess 62 are constituted by a photosensitive material, a method can be used in which one photosensitive material layer is provided on a silicon wafer surface by forming a film of the photosensitive material on the silicon wafer surface and curing the film, and the recess 62 is provided by forming the film of the photosensitive material again on the surface of the photosensitive material layer and performing exposure and development. In this case, the compositions of the photosensitive material on the silicon wafer surface side and the photosensitive material further provided on the outermost layer may be different from each other. The photosensitive material can be appropriately selected in consideration of the wettability, contaminating properties, and the like of the solder particle. In particular, when the solder particle formed in the recess 62 is transferred onto the electrode, there is possibility that the surface of the photosensitive material layer on the outermost layer is in contact with the upper part of the electrode or the surface of the substrate having the electrode. Therefore, a photosensitive material that does not damage the electrode and the substrate or does not contaminate the electrode and the substrate can be appropriately selected. The photosensitive material may be a material that prevents contamination due to elution of an uncured component, a halogen-based material, a silicone-based material, or the like. Furthermore, the photosensitive material may be a material having high resistance to a reducing atmosphere, flux, or the like when the solder particle is transferred to the electrode. For example, the photosensitive material may be a material that is resistant to a reducing atmosphere such as formic acid, hydrogen, or hydrogen radical. Further, the photosensitive material may be a material having high resistance to a temperature when the solder particle is transferred to the electrode. Specifically, the photosensitive material may be a material that is resistant to a temperature of 100° C. or higher and 340° C. or lower. Since the melting point of the solder particle varies depending on the constituent material thereof, a heat resisting temperature of the photosensitive material can also be selected depending on a solder material used. In the case of using tin-silver-copper-based solder (for example, SAC305 (melting point: 219° C.)) that is lead-free solder widely used for electronic devices, a material having heat resistance at 220° C. or higher, particularly, heat resistance at 260° C. or higher that is used in a reflow process can be used, In the case of using tin-bismuth solder (for example, SnBi58 (melting point: 139° C.)), a material having heat resistance at 140° C. or higher can be used, and industrial applicability expands as long as a material having heat resistance at 160°

C. or higher is used. In the case of using indium solder (melting point: 159° C.), a material having heat resistance at 170° C. or higher can be used. In the case of using indium-tin solder (for example, melting point: 120° C.), a material having heat resistance at 130° C. or higher can be used.

As another base substrate, a base substrate having the recess 62 formed by a thermosetting or thermoplastic resin on a stainless steel plate is exemplified. This base substrate can be obtained by a method in which a thermosetting material (resin) is sandwiched between a stainless steel plate and an imprint mold and heated and pressurized, and then the imprint mold is removed. As another base substrate, a base substrate having the recess 62 formed by a photocurable material on a glass plate is exemplified. This base substrate can be obtained by a method in which a photocurable material is applied onto a glass plate, the photocurable material is cured by exposure while an imprint mold is pressed, and the imprint mold is removed. In the case of forming the recess 62 using the imprint mold, the material configurations of the inner wall and the bottom portion of the recess 62 can be changed by pressurized conditions. For example, in the case of loosely setting pressurized condition, the inner wall and the bottom portion of the recess 62 can have a configuration of the same resin material. On the other hand, in the case of strongly setting pressurized condition, the inner wall of the recess 62 can have a configuration of a resin material and the bottom portion thereof can have a configuration of an inorganic material.

As the material for the base layer 601, a composite material containing a glass fiber, a filler, or the like and a resin component can be used. Examples of the composite material include a copper-clad laminate for a wiring board. The recess 62 can be formed as described above by applying a photosensitive material, a thermosetting resin, a photocurable resin, or the like to the surface of the copper-clad laminate. The copper-clad laminate mainly contains a large amount of a resin material, but CTE can be minimized by a combination of a glass fiber, various fillers, and the like, and thus dimension stability described above can be secured. Furthermore, in the case of forming the electrode on the copper-clad laminate, when the recess 62 is also formed on the copper-clad laminate, CTEs of both of the electrode and the recess are the same value or values close to each other, so that there is an advantage that positioning is easy when the solder particle in the recess 62 is transferred and positional deviation is less likely to occur.

As the material for the recess layer 602, a sealing material for package can also be used. As the sealing material, any of solid, liquid, and film-shaped sealing materials can be used. The recess 62 can be formed by stacking the sealing material, as a thin layer, on glass, a silicon wafer, or the like and heating and pressurizing the obtained product with an imprint mold.

<Method for Manufacturing Solder Bump Forming Member>

A method for manufacturing the solder bump forming member 10 includes a preparing step of preparing a base substrate having a plurality of recesses and solder fine particles, an accommodating step of accommodating at least some of the solder fine particles in the recess, and a fusing step of fusing the solder fine particles accommodated in the recess to form a solder particle in the recess, a part of the solder particle projecting from the recess.

The method for manufacturing the solder bump forming member 10 according to a first embodiment will be described with reference to FIGS. 3 to 6.

Figure 3A:
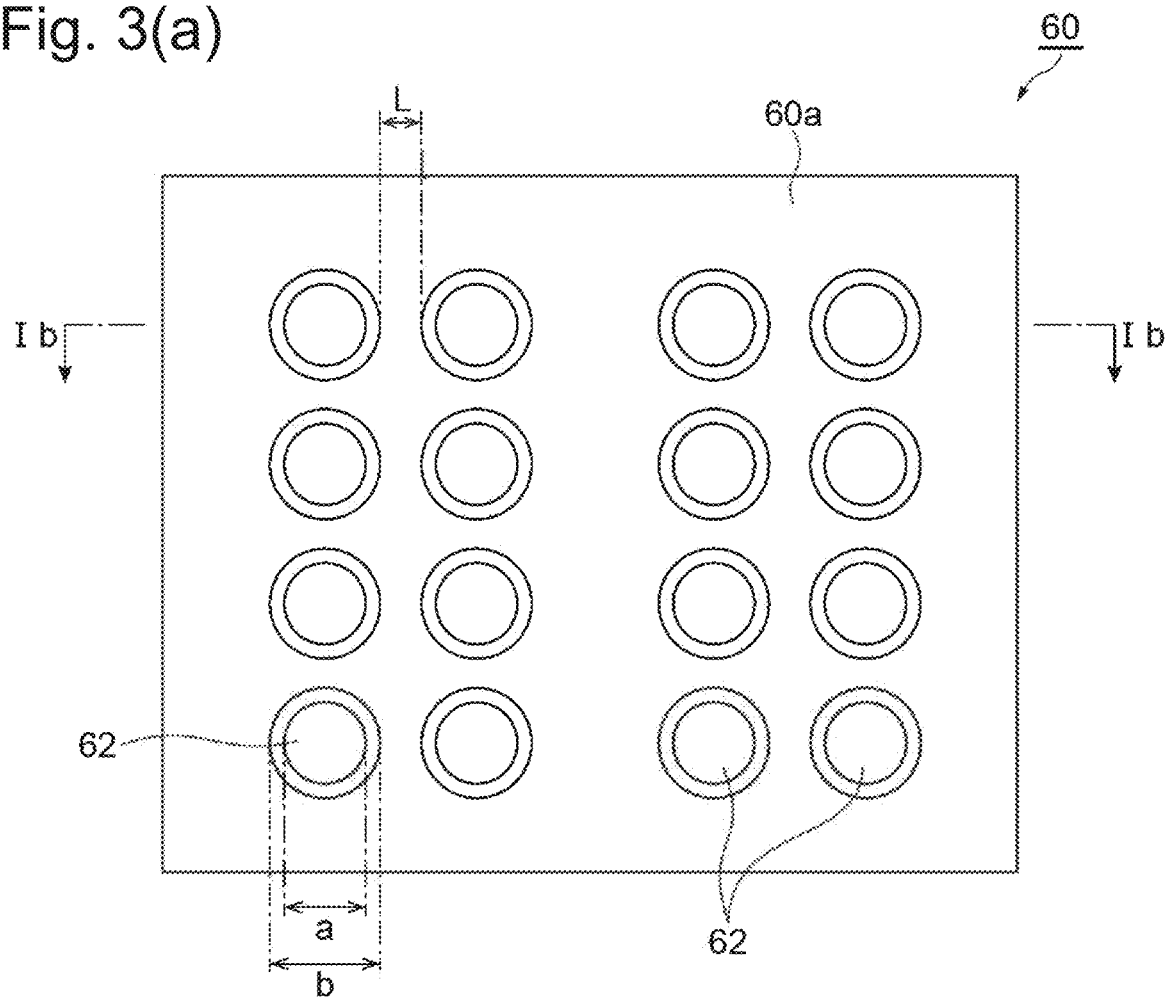
FIG. 3(a) is a plan view schematically illustrating an example of a base substrate.
Figure 3B:
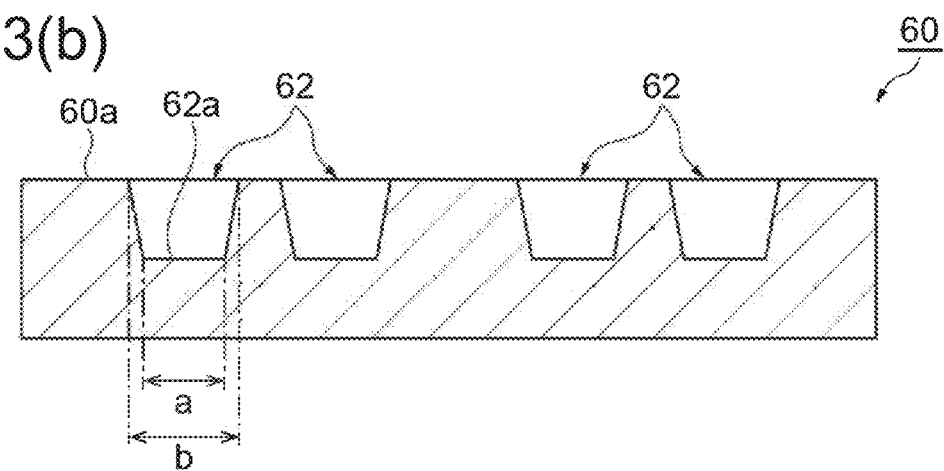
FIG. 3(b) is a cross-sectional view taken along line Ib-Ib of FIG. 3(a).
Figure 4A:
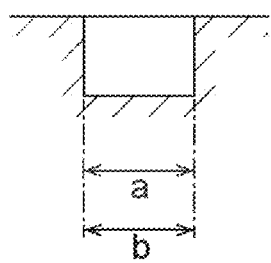
FIGS. 4(a) to 4(h) are cross-sectional views schematically illustrating examples of a cross-sectional shape of a recess of the base substrate.
Figure 4B:
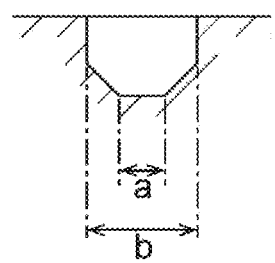
Figure 4C:
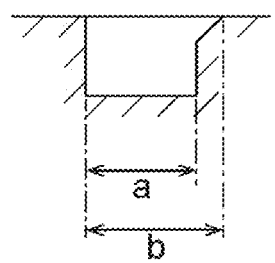
Figure 4D:
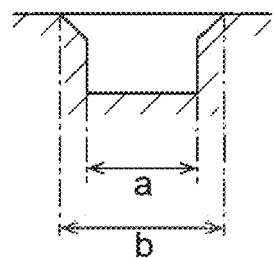
Figure 4E:
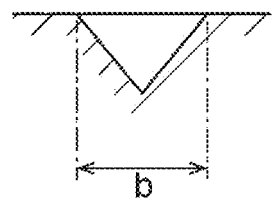
Figure 4F:
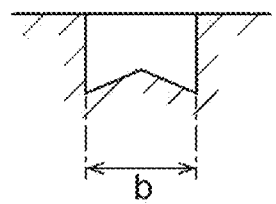
Figure 4G:
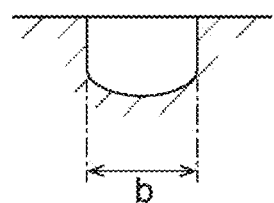
Figure 4H:
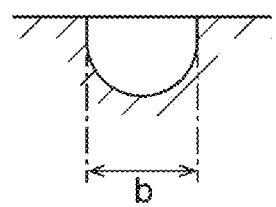

First, solder fine particles and the base substrate 60 for accommodating the solder fine particles are prepared. FIG. 3(a) is a plan view schematically illustrating an example of the base substrate 60, and FIG. 3(b) is a cross-sectional view taken along line Ib-Ib of FIG. 3(a). The base substrate 60 illustrated in FIG. 3(a) has the plurality of recesses 62. The plurality of recesses 62 may be regularly disposed with a predetermined pattern. The position, the number, and the like of the plurality of recesses 62 may be set depending on the shape, the size, the pattern, and the like of electrodes to be connected.

A distance L between the recesses adjacent to each other is not particularly limited, but can be set to be 0.1 times or more the average particle diameter of the solder particle to be accommodated and may be 0.2 times or more. The upper limit of the value can be set, for example, to 0.3 times. The distance between the recesses is not a distance between the centers of the recesses, but is a distance between the edges of the recess opening The recess 62 of the base substrate 60 is preferably formed in a tapered shape in which the opening area expands from a bottom portion 62a side of the recess 62 toward a surface 60a of the base substrate 60. That is, as illustrated in FIG. 3(a) and FIG. 3(b), the width (width a in FIG. 3(a) and FIG. 3(b)) of the bottom portion 62a of the recess 62 is preferably narrower than the width (width b in FIG. 3(a) and FIG. 3(b)) of the opening of the recess 62 on the surface 60a. Further, the size (such as the width a, the width h, the volume, and the tapering angle and depth) of the recess 62 may be set depending on the size of a target solder particle.

Note that, the shape of the recess 62 may be a shape other than the shapes illustrated in FIG. 3(a) and FIG. 3(b). For example, the shape of the opening of the recess 62 on the surface 60a may be an elliptical shape, a triangular shape, a quadrangular shape, a polygonal shape, and the like, in addition to the circular shape as illustrated in FIG. 3(a).

Furthermore, the shape of the recess 62 in a cross-section perpendicular to the surface 60a may be, for example, shapes illustrated in FIG. 4. FIGS. 4(a) to 4(b) are cross-sectional views schematically illustrating examples of a cross-sectional shape of a recess of the base substrate. In all the cross-sectional shapes illustrated in FIGS. 4(a) to 4(h), the width (width b) of the opening of the recess 62 on the surface 60a is the maximum width in the cross-sectional shape. As such, the solder particle formed in the recess 62 is easily extracted, so that workability is improved. Furthermore, since the width (width b) of the opening is the maximum width in the cross-sectional shape, in a case where the solder particle 1 is transferred onto the electrode, the solder particle 1 is easily extracted from the recess 62, so that improvement in a transfer rate can be expected. Furthermore, by appropriately adjusting the width (width b) of the opening, the positional deviation when the solder particle 1 is transferred onto the electrode is less likely to occur, so that solder bumps are easily formed at accurate positions.

The solder fine particle to be prepared in the preparing step may include a fine particle having a particle diameter smaller than the width (width b) of the opening of the recess 62 on the surface 60a, and preferably includes a larger amount of fine particles having a particle diameter smaller than the width b. For example, as for the solder fine particles, the D10 particle diameter of the particle size distribution is preferably smaller than the width h, the D30 particle diameter of the particle size distribution is more preferably smaller than the width b, and the D50 particle diameter of the particle size distribution is further preferably smaller than the width b.

The particle size distribution of the solder fine particles can be measured using various methods suitable for sizes. For example, methods such as a dynamic light scattering method, a laser diffraction method, a centrifugal sedimentation method, an electrical sensing zone method, a resonance mass measurement method can be used. Further, a method of measuring a particle size from an image obtained with an optical microscope, an electronic microscope, or the like can be used. Specific examples of a device include a flow-type particle image analyzer, a Microtrac, and a Coulter counter.

The C.V. value of the solder fine particle to be prepared in the preparing step is not particularly limited, but from the viewpoint of improving the filling property of the solder fine particles in the recesses 62 by combination of small and large fine particles, the C.V. value is preferably high. For example, the C.V. value of the solder fine particle may exceed 20%, and is preferably 25% or more and more preferably 30% or more.

The C.V. value of the solder fine particle is calculated by multiplying a value, which is obtained by dividing the standard deviation of the particle diameter measured by the aforementioned method by the average particle diameter (D50 particle diameter), by 100.

The solder fine particle may contain tin or a tin alloy. As the tin alloy, for example, an In—Sn alloy, an In—Sn—Ag alloy, an Sn—Au alloy, an Sn—Bi alloy, an Sn—Bi—Ag alloy, an Sn—Ag—Cu alloy, an Sn—Cu al oy, and the like can be used. Specific examples of these tin alloys include the following examples.

In—Sn(In 52% by mass, Bi 48% by mass, melting point: 118° C.)
In—Sn—Ag(In 20% by mass, Sn 77.2% by mass, Ag 2.8% by mass, melting point: 175° C.)
Sn—Bi(Sn 43% by mass, Bi 57% by mass, melting point: 138° C.)
Sn—Bi—Ag(Sn 42% by mass, Bi 57% by mass, Ag 1% by mass, melting point: 139° C.)
Sn—Ag—Cu(Sn 96.5% by mass, Ag 3% by mass, Cu 0.5% by mass, melting point: 217° C.)
Sn—Cu(Sn 99.3% by mass, Cu 0.7% by mass, melting point: 227° C.)
Sn—Au(Sn 21.0% by mass, Au 79,0% by mass, melting point: 278° C.)

The solder fine particle may contain indium or an indium alloy. As the indium alloy, for example, an In—Bi alloy, an In—Ag alloy, and the like can be used. Specific examples of these indium alloys include the following examples.

In—Bi(In 66,3% by mass, Bi 33,7% by mass, melting point: 72° C.)
In—Bi(In 33.0% by mass, Bi 67.0% by mass, melting point: 109° C.)
In—Ag (in 97.0% by mass, Ag 3.0% by mass, melting point: 145° C.)

The tin alloy or the indium alloy can be selected depending on the use application (temperature at the time of use) and the like of the solder particle. For example, in a case where solder particles used in fusing at a low temperature are desired to be obtained, an In—Sn alloy and an Sn—Bi alloy may be employed, and in this case, solder particles capable of being fused at 150° C. or lower are obtainable. In the case of employing a material having a high melting point such as an Sn—Ag—Cu alloy and an Sn—Cu alloy, solder particles capable of maintaining high reliability can be obtained even after high-temperature exposure.

The solder fine particle may contain one or more kinds selected from Ag, Cu, Ni, Bi, Zn, Pd, Pb, Au, P, and B. Among these elements, from the following viewpoints, the solder particle 1 may contain Ag or Cu. That is, effects are exhibited in which the melting point of solder particles to be obtained can be decreased to about 220° C., and more favorable conduction reliability is obtained by obtaining solder particles having an excellent bonding strength to electrodes, by the solder fine particle containing Ag or Cu.

The Cu content rate of the solder fine particle is, for example, 0.05 to 10% by mass, and may be 0.1 to 5% by mass or 0.2 to 3% by mass. When the Cu content rate is 0.05% by mass or more, a solder particle capable of achieving more favorable solder connection reliability is easily obtained. Furthermore, when the Cu content rate is 10% by mass or less, a solder particle having a low melting point and excellent wettability is easily obtained, and as a result, the connection reliability of the electrode provided with solder bumps is likely to be inure favorable.

The Ag content rate of the solder fine particle is, for example, 0.05 to 10% by mass, and may be 0.1 to 5% by mass or 0.2 to 3% by mass. When the Ag content rate is 0.05% by mass or more, a solder particle capable of achieving more favorable solder connection reliability is easily obtained. Furthermore, when the Ag content rate is 10% by mass or less, a solder particle having a low melting point and excellent wettability is easily obtained, and as a result, the connection reliability of the electrode provided with solder bumps is likely to be more favorable.

In the accommodating step, the solder fine particles prepared in the preparing step are accommodated in the recesses 62 of the base substrate 60, respectively. The accommodating step may be a step of accommodating all the solder fine particles prepared in the preparing step in the recesses 62, or may be a step of accommodating some of solder fine particles prepared in the preparing step (for example, solder fine particles smaller than the width b of the opening of the recess 62 among the solder fine particles) in the recesses 62.

Figure 5:
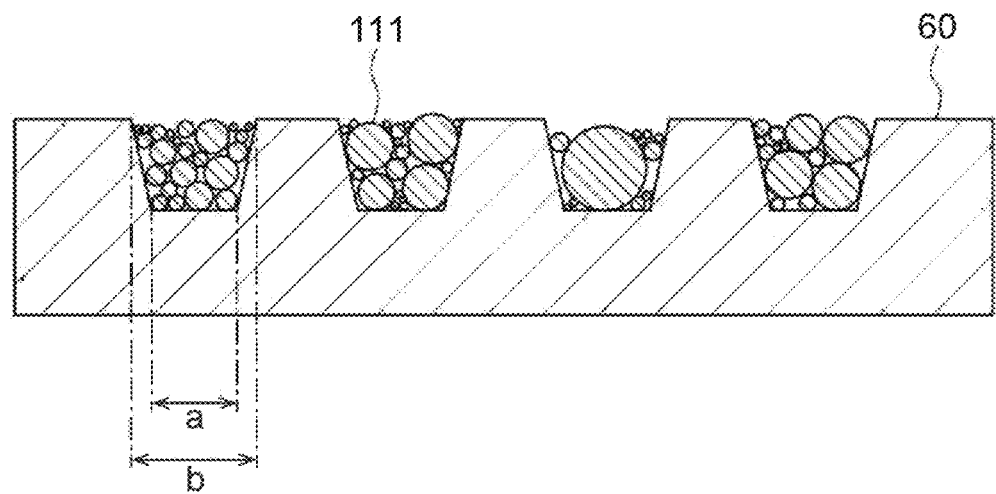
FIG. 5 is a cross-sectional view schematically illustrating a state where solder fine particles are accommodated in the recesses of the base substrate.

FIG. 5 is a cross-sectional view schematically illustrating a state where solder fine particles 111 are accommodated in the recess 62 of the base substrate 60. As illustrated in FIG. 5, a plurality of solder fine particles 111 are accommodated in the plurality of recesses 62, respectively.

The degree of projection of the solder particle 1 can be adjusted by adjusting the amount of the solder fine particles 111 accommodated in the recess 62. The amount of the solder fine particles 111 accommodated in the recess 62 is, for example, preferably 20% or more, more preferably 30% or more, further preferably 50% or more, and most preferably 60% or more, with respect to the volume of the recess 62. As such, a part of the solder particle can be projected from the recess 62. Furthermore, variation in the accommodated amount is suppressed, and solder particles having a smaller particle size distribution are easily obtained.

In general, when the solder material is in a. molten state in an environment equal to or higher than the melting point, the solder material has a property of being aggregated in a sphere shape by own surface tension.

The solder fine particles 111 accommodated in the recess 62 are aggregated by a fusing step described below to obtain the solder particle 1. The height of the obtained solder particle 1 is higher than the depth of the recess 62, and the solder particle 1 projects more than the recess 62. Therefore, when the diameter of the solder particle 1 is larger than the depth of the recess 62, the solder particle 1 projects more than the recess 62. Since the diameter of the solder particle 1 can be adjusted by the shape of the recess 62 and the amount of the solder fine particles 111 accommodated in the recess 62, this can adjust the degree of projection from the recess 62.

Furthermore, when the solder fine particles 111 are melted in the fusing step described below, depending on the materials for the bottom portion and the inner wall portion of the recess 62, wetting and spreading occur in the bottom portion and the inner wall portion, and a portion which is in contact with the bottom portion and/or the inner wall portion of the recess 62 is generated in at least a part of the solder particle 1. As such, the planar portion may be generated in at least a part of the solder particle 1. The size of this planar portion varies depending on a combination of surface materials for the bottom portion and the inner wall portion of the recess 62 and a solder composition constituting the solder fine particle 111. Therefore, the form of the solder particle 1 is a perfect sphere form, an ellipsoidal body; a flattened sphere, a form partially having a planar portion, or the like. As the base substrate 60, an inorganic matter such as glass or silicon, or an organic matter such as plastic or a resin can be used, the bottom portion and the inner wall portion formed of such a material generally tend to have low wettability with solder, and the solder particle 1 is likely to become a sphere shape approximately close to a perfect sphere. Therefore, assuming that the solder particle 1 is a sphere close to a perfect sphere, the height of the solder particle 1 can also be approximated to the diameter of the solder particle 1. Since the diameter of the solder particle 1 can be calculated from the total volume of the solder fine particles 111 filled in the recess 62, the amount of the solder fine particles 111 necessary for projection of the solder particle 1 from the recess 62 can be calculated.

Assuming that all the solder fine particles 111 filled in the recess 62 are melted and aggregated to become the solder particle 1 and the solder particle 1 is a sphere, the amount of the solder fine particles 111 necessary for projection of the solder particle 1 from the recess 62 can be represented.

When the upper part diameter (opening width b) of the recess 62 is designated as L and the depth of the recess 62 is designated as D, the aspect ratio of the recess is represented as L/D. At this time, it is preferable that the filling rate of the solder fine particles 111 in the recess 62 is 66 vol % or more in the case of the aspect ratio of 1, 38 vol % or more in the case of the aspect ratio of 0.75, 17 vol % or more in the case of the aspect ratio of 0.5, and 5 vol % or more in the case of the aspect ratio of 0.25.

In order to suppress variation in the accommodated amount, the average particle diameter, the particle sizes, and the like of the solder fine particles 111 may be selected depending on the size and the ratio of the diameter to the depth (aspect ratio) of the recess 62. For example, in a case where the diameter of the recess 62 is 4 μm and the depth thereof is 4 μm (aspect ratio is 1), by using the solder fine particle 111 having an average particle diameter of 1 to 2 μm or less, variation of the filling amount of the recess 62 can be suppressed, variation in the diameter of the obtained solder particle 1 is also suppressed, and variation in the projection amount (height) from the recess 62 is also easily suppressed. When the variation in the projection amount (height) from the recess 62 is suppressed, contact between the solder particle 1 and the electrode is stabilized at the time of pressing the solder particle 1 against the electrode, and formation variation of solder bumps is easily suppressed.

When the solder fine particles 111 accommodated in the recess 62 are melted and aggregated, in order to aggregate the solder fine particles 111 into one particle, the bottom portion shape of the recess 62 may be adjusted. For example,
as in FIGS. 4(*b*), 4(*e*), 4(*g*), and 4(*h*), a bottom portion shape having a gradient toward the center is preferably selected. In particular, in a case where the aspect ratio of the recess 62 is large, in other words, in a case where the opening width of the recess 62 is wide and has a shallow shape, when the solder fine particles 111 are melted, the solder fine particles 111 that are not aggregated and remain are likely to be generated, so that the shape of the bottom portion of the recess 62 is preferably adjusted as in FIGS. 4(*b*), 4(*e*), 4(*g*), and 4(*h*).

A method for accommodating the solder fine particles in the recess 62 is not particularly limited. The accommodating method may be either a dry type or a wet type. For example, by disposing the solder fine particles prepared in the preparing step on the base substrate 60 and rubbing the surface 60*a* of the base substrate 60 using a squeegee, a sufficient amount of solder fine particles can be accommodated in the recess 62 while excessive solder fine particles are removed. In a case where the width b of the opening of the recess 62 is larger than the depth of the recess 62, the solder fine particles may protrude from the opening of the recess 62. When a squeegee is used, the solder fine particles protruding from the opening of the recess 62 are removed. Examples of a method for removing excessive solder fine particles also include methods such as blowing of compressed air and rubbing of the surface 60*a* of the base substrate 60 with a non-woven fabric or a fiber bundle. These methods are preferred in handling of solder fine particles that are easily transformed, since a physical force is weaker than a squeegee. Furthermore, in these methods, the solder fine particles protruding from the opening of the recess 62 can remain in the recess.

The fusing step is a step of fusing the solder fine particles 111 accommodated in the recess 62 (for example, heating the solder fine particles 111 to 130 to 260° C. to form the solder particle 1 in the recess 62, a part of the solder particle 1 projecting from the recess 62. The solder fine particles 111 accommodated in the recess 62 are melted to be aggregated and are spheroidized by surface tension. At this time, in a contact portion with the bottom portion 62*a* of the recess 62, the molten solder follows the bottom portion 62*a* to form the planar portion 11. As such, the solder particle 1 thus formed has a shape having the planar portion 11 on a part of the surface. In this way, the solder bump forming member 10 illustrated in FIG. 1 is obtained.

Examples of a method for melting the solder fine particles 111 accommodated in the recess 62 include a method of heating the solder fine particles 111 to a melting point or higher of solder. The solder fine particles 111 are not melted, are not wetted and spread, or are not aggregated even when being heated at a temperature equal to or higher than the melting point of the solder particle due to the influence of an oxide film, in some cases. Therefore, the solder fine particle ill is exposed to a reducing atmosphere to remove a surface oxide film of the solder fine particle 111, and then is heated at a temperature equal to or higher than the melting point of the solder fine particle 111, so that the solder fine particle 111 can be melted, wetted and spread, and aggregated. Furthermore, it is preferable to melt the solder fine particles 111 in a reducing atmosphere. When the solder fine particle 111 is heated to the melting point or higher of the solder fine particle 111 and in a reducing atmosphere, and the oxide film of the surface of the solder fine particle 111 is reduced, so that melting, wetting, and spreading, and aggregation of the solder fine particle 111 is easy to effectively proceed. That is, the method for manufacturing a solder bump forming member may further include a reducing step of exposing the solder fine particles accommodated in the recess to a reducing atmosphere, before the fusing step. Furthermore, in the fusing step of the method for manufacturing a solder bump forming member, the solder fine particles may be fused in a reducing atmosphere.

A method for setting a reducing atmosphere is not particularly limited as long as it is a method by which the above-described effect is obtained, and for example, methods using hydrogen gas, hydrogen radical, formic acid gas, and the like are mentioned. For example, when a hydrogen reduction furnace, a hydrogen radical reduction furnace, a formic acid reduction furnace, or a conveyor furnace or continuous furnace of these, the solder fine particles 111 can be melted in a reducing atmosphere. These devices may include a heating device, a chamber in which inert gas (such as nitrogen or argon) is filled, a mechanism that vacuumizes the inside of the chamber, and the like in the furnace, thereby easily controlling reducing gas. Furthermore, when the inside of the chamber can be vacuumized, voids can be removed by depressurization after melting and aggregation of the solder fine particles 111, and the solder particle 1 further excellent in connection stability can be obtained.

Profiles such as reduction of the solder fine particles 111, melting conditions, temperature, atmosphere adjustment inside the furnace, and the like may be appropriately set in consideration of the melting point and particle size of the solder fine particle 111, the recess size, the material for the base substrate 60, and the like. For example, the solder particle 1 can be Obtained as follows. The base substrate 60 in which the solder fine particles 111 are filled in the recess is inserted into a furnace, vacuuming is performed, reducing gas is then introduced to fill the reducing gas in the furnace, the surface oxide film of the solder fine particle 111 is removed, and then the reducing gas is removed by vacuuming. Thereafter, the solder fine particle 111 is heated to the melting point or higher of the solder fine particle 111 to melt and aggregate the solder fine particles, the solder particle is formed in the recess 62, and then the temperature in the furnace is returned to room temperature after the nitrogen gas is filled in the furnace. Furthermore, for example, the solder particle 1 can be obtained as follows. The base substrate 60 in which the solder fine particles 111 are filled in the recess is inserted into a furnace, vacuuming is performed, reducing gas is then introduced to fill the reducing gas in the furnace, the solder fine particles 111 are heated using a heating heater in the furnace, the surface oxide film of the solder fine particle 111 is removed, and then the reducing gas is removed by vacuuming. Thereafter, the solder fine particle 111 is heated to the melting point or higher of the solder fine particle 111 to melt and aggregate the solder fine particles, the solder particle is formed in the recess 62, and then the temperature in the furnace is returned to room temperature after the nitrogen gas is filled in the furnace. By heating the solder fine particles in a reducing atmosphere, there is an advantage that reduction power is increased, and the surface oxide film of the solder fine particle is easily removed.

Further, for example, the solder particle 1 can be obtained as follows. The base substrate 60 in which the solder fine particles 111 are filled in the recess is inserted into a furnace, vacuuming is performed, reducing gas is then introduced to fill the reducing gas in the furnace, the solder fine particle 111 is heated to the melting point or higher of the solder fine particle 111 using a heating heater in the furnace, the surface oxide film of the solder fine particle 111 is removed by reduction, and at the same time, the solder fine particles are melted and aggregated to form the solder particle in the recess 62, and the reducing gas is removed by vacuuming. Then, voids in the solder particle are reduced, and then the temperature in the furnace is returned to room temperature after the nitrogen gas is filled in the furnace. In this case, since it is sufficient to perform conditioning of each of increasing and decreasing of the temperature in the furnace once, there is an advantage that treatment is possible in a short time.

A step of forming the solder particle in the above-described recess 62, then setting the inside of the furnace to a reducing atmosphere once more, and removing a surface oxide film, which has not been removed, may be added. As such, residue such as solder fine particles remaining without being fused or a part of the oxide film remaining without being fused can be reduced.

In the case of using a conveyor furnace in an atmospheric pressure, the base substrate 60 in which the solder fine particles 111 are filled in the recess is placed on a conveyor for conveying, and the base substrate 60 is continuously passed through a plurality of zones, so that the solder particle 1 can be obtained. For example, the solder particle 1 can be obtained as follows. The base substrate 60 in which the solder fine particles 111 are filled in the recess is placed on a conveyor set at a constant speed and passed through a zone filled with inert gas, such as nitrogen or argon, at a temperature lower than the melting point of the solder fine particle 111. Subsequently, the base substrate 60 is passed through a zone in which reducing gas such as formic acid gas at a temperature lower than the melting point of the solder fine particle 111 is present, and the surface oxide film of the solder fine particle 111 is removed. Subsequently, the base substrate 60 is passed through a zone filled with inert gas, such as nitrogen or argon, at a temperature equal to or higher than the melting point of the solder fine particle 111 to melt and aggregate the solder fine particles 111, and subsequently, is passed through a cooling zone filled with inert gas such as nitrogen or argon. For example, the solder particle 1 can be obtained as follows. The base substrate 60 in which the solder fine particles 111 are filled in the recess is placed on a conveyor set at a constant speed and passed through a zone filled with inert gas, such as nitrogen or argon, at a temperature equal to or higher than the melting point of the solder fine particle 111. Subsequently, the base substrate 60 is passed through a zone in which reducing gas such as formic acid gas at a temperature equal to or higher than the melting point of the solder fine particle 111 is present, the surface oxide film of the solder fine particle 111 is removed to melt and aggregate the solder fine particles 111, and subsequently, the base substrate 60 is passed through a cooling zone filled with inert gas such as nitrogen or argon. Since the treatment in an atmospheric pressure can be performed in the above-described conveyor furnace, a film-shaped material can also be continuously treated by roll-to-roll. For example, a continuously rolled product of the base substrate 60 in which the solder fine particles 111 are filled in the recess is produced, a roll unwinding machine and a roll wind-up machine are installed at the inlet side of the conveyor furnace and the outlet side of the conveyor furnace, respectively. The base substrate 60 is conveyed at a constant speed and is passed through each zone in the conveyor furnace. Thus, the solder fine particles 111 filled in the recess can be fused.

Through the preparing step to the fusing step, the solder particle 1 having a uniform size can be formed regardless of the material and shape of the solder fine particle 111. For example, indium-based solder can be precipitated by plating, but is difficult to be precipitated in a particle shape and handling thereof is difficult because the indium-based solder is soft. However, in the above-described method, by using indium-based solder fine particles as a raw material, indium-based solder particles having a uniform particle diameter can be easily manufactured. Furthermore, since the formed solder particle 1 can be handled in a state of being accommodated in the recess 62 of the base substrate 60, transportation, storage, and the like are possible without the solder particle 1 being transformed. Further, since the formed solder particle 1 is in a state of being accommodated in the recess 62 of the base substrate 60, contact with the electrode is possible without the solder particle being transformed. A solder particle to be obtained may have an average particle diameter of 1 to 35 µm and a C.V. value of 20% or less.

Furthermore, the solder fine particle 111 may have an irregular shape even when variation in the particle size distribution is large, and can be suitably used as a raw material as long as it can be accommodated in the recess 62.

Furthermore, in the above-described method, the shape of the recess 62 of the base substrate 60 can be freely designed by lithography, machine processing, an imprint technology, and the like. The size of the solder particle 1 depends on the amount of the solder fine particles 111 accommodated in the recess 62, so that the size of the solder particle 1 can be freely designed depending on the design of the recess 62.

<Method for Manufacturing Electrode Substrate Provided with Solder Bumps>

A method for manufacturing an electrode substrate provided with solder bumps includes a preparing step of preparing the above-described solder bump forming member and a substrate having a plurality of electrodes, a disposing step of allowing a surface having the recesses of the solder hump forming member and a surface having the electrodes of the substrate to face each other so as to bring the solder particle and the electrode into contact with each other, and a heating step of heating the solder particle at a temperature equal to or higher than a melting point of the solder particle.

Specific examples of the substrate (circuit member) having a plurality of electrodes on the surface thereof include chip parts such as an IC chip (semiconductor chip), a resistor chip, a capacitor chip, and a driver IC; and a rigid package substrate. These circuit members include a circuit electrode, and generally include a plurality of circuit electrodes. Other examples of the substrate having a plurality of electrodes on the surface thereof include wiring substrates such as a flexible tape substrate having a metal wiring, a flexible printed circuit board, and a glass substrate with indium tin oxide (ITO) deposited.

Specific examples of the electrode include copper, copper/nickel, copper/nickel/gold. copper/nickel/palladium, copper/nickel/palladium/gold, copper/nickel/gold, copper/palladium, copper/palladium/gold, copper/tin, copper/silver, and indium tin oxide electrodes. The electrode can be formed by non-electrolytic plating, electrolytic plating, sputtering, or etching of a metal foil.

Figure 6A:
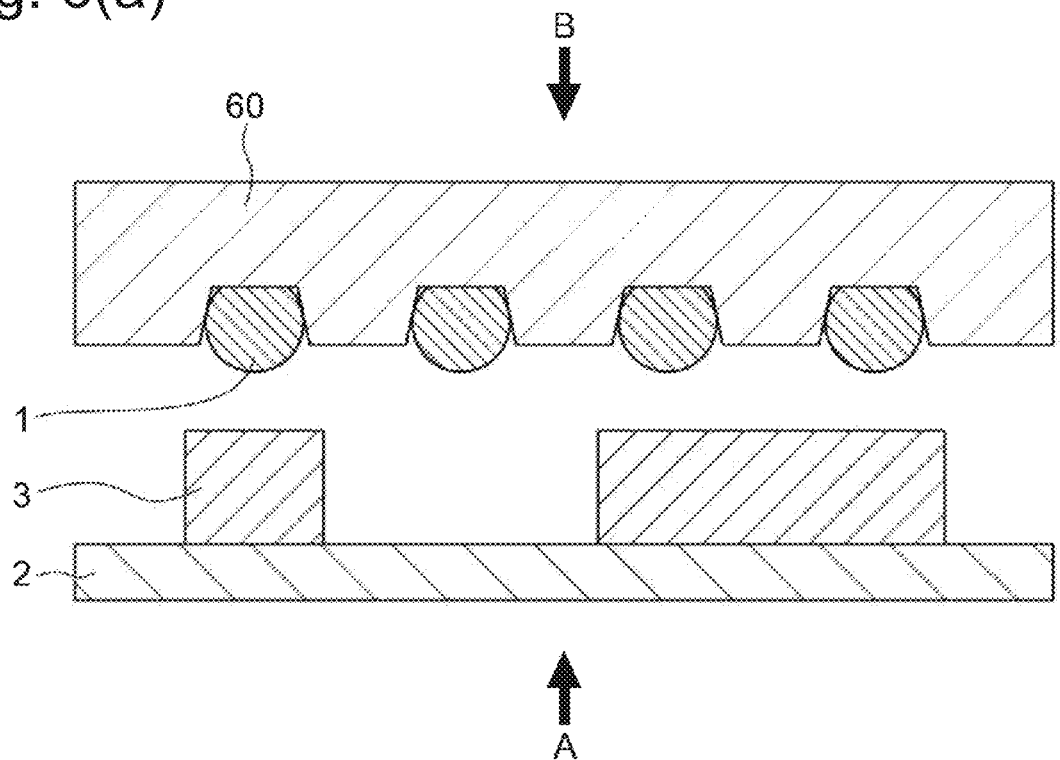
FIG. 6(a) and FIG. 6(b) are cross-sectional views schematically illustrating examples of manufacturing processes of an electrode substrate provided with solder bumps.

FIG. 6(*a*) and FIG. 6(*b*) are cross-sectional views schematically illustrating examples of manufacturing processes of an electrode substrate provided with solder bumps. The base substrate 60 illustrated in FIG. 6(*a*) is in a state where one solder particle 1 is accommodated in each of the recesses 62. Meanwhile, the substrate 2 has a plurality of electrodes 3 on the surface thereof. The base substrate 60 and the substrate 2 are close to each other while the surface of the substrate 2 on the electrode 3 side faces the surface of the base substrate 60 on the opening side of the recess 62 until the solder particle 1 accommodated in the recess 62 of the base substrate 60 is in contact with the electrode 3 (arrows A and B in FIG. 6(*a*)). The number of solder particles 1 that are in contact with the respective electrodes 3 is not particularly limited, and may be one particle with respect to one electrode or may be a plurality of particles with respect to one electrode. Note that, since the force acting between the solder particle 1 and the recess 62 (for example, intermolecular force such as van der Waals' force) is larger than the force of gravity applied to the solder particle 1, even when the main surface of the base substrate 60 faces downward, the solder particle 1 does not drop off and remains in the recess 62. Furthermore, in a case where at least a part of the solder particle 1 is in contact with the bottom portion and/or the inner wall portion of the recess 62 and the solder particle 1 has a planar portion, the solder particle 1 is in close contact with the recess 62 and hardly drops off In this state, the entirety is subjected to at least heating at a temperature (for example, 130 to 260° C.) higher than the melting point of the solder particle 1, so that the solder particle 1 is melted to form a. solder bump on the electrode 3. From the viewpoint of more suitably performing bonding between the solder particle 1 and the electrode 3, in the heating step, the solder particle 1 may be heated at a temperature equal to or higher than a melting point of the solder particle while bringing the solder particle 1 and the electrode 3 into contact with each other in a pressurized state. The pressurized state indicates a state where the solder hump forming member 10 and the substrate 2 are pressed against each other in the directions of the arrows A and B in FIG. 6(*a*) with a force of about 20 to 600 MPa.

The solder particle 1 is not melted or is not wetted and spread even when being heated at a. temperature equal to or higher than the melting point of the solder particle due to the influence of an oxide film, in some cases. Therefore, the solder particle 1 is exposed to a reducing atmosphere to remove a surface oxide film of the solder particle 1, and then is heated at a temperature equal to or higher than the melting point of the solder particle 1, so that the solder particle 1 can be melted. Furthermore, it is preferable to melt the solder particle 1 in a reducing atmosphere. When the solder particle 1 is heated to the melting point or higher of the solder particle 1 and in a reducing atmosphere, the oxide film of the surface of the solder particle 1 is reduced, and the oxide film of the electrode surface is reduced, so that melting, wetting, and spreading of the solder particle 1 is easy to effectively proceed. That is, the method for manufacturing an electrode substrate provided with solder bumps may further include a reducing step of exposing the solder particle (and/or electrode) to a reducing atmosphere, before the disposing step or after the heating step. Furthermore, in the heating step of the method for manufacturing an electrode substrate provided with solder bumps, the solder particle may be heated at a temperature equal to or higher than a melting point of the solder particle in a reducing atmosphere. In the heating step in which solder bumps are formed on electrodes, when the electrodes and opening portion surfaces of the solder bump forming member are in close contact with each other (in a pressurized state as necessary), solder bumps are formed only on electrodes, and a bridge due to solder between the electrodes adjacent to each other is easily suppressed.

The description of the method fir manufacturing a solder bump forming member can be referred to appropriately referred to with regard to details of the reducing atmosphere.

Figure 6B:
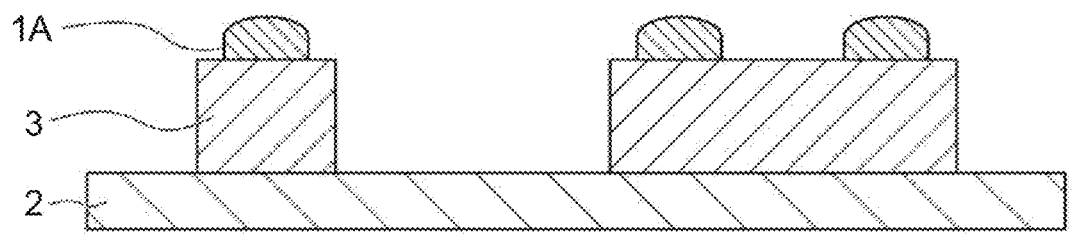

After the heating step, when the entirety is cooled, the upper part of the electrode 3 and a solder bump 1A formed by melting the solder particle 1 are fixed to each other, and both the solder bump 1A and the electrode 3 are electrically connected. The method for manufacturing an electrode substrate provided with solder bumps may further include a removing step of removing the solder bump forming member from the substrate, after the heating step. After the solder bump 1A is formed on the electrode 3, the solder bump forming member 10 is removed from the substrate 2 (removing step), so that an electrode substrate 20 provided with solder bumps can be obtained. FIG. 6(b) is a schematic view of the electrode substrate 20 provided with solder bumps obtained in this way. When alignment marks are present on surfaces of the solder bump forming member and the base substrate, positioning is easily performed, which is preferable. For example, when the recess of the solder bump forming member and the electrode surface side of the base substrate surface face each other, the recess and the electrode are disposed in advance at a position in which the position of the recess of the solder bump limning member and the position of the electrode of the base substrate surface face each other. After the solder particle is disposed in the recess of the solder bump forming member, the opening surface side of the recess of the solder bump forming member and the electrode surface side of the base material face each other, and the positions of an electrode on which a solder bump is desired to be formed and the recess of the solder bump forming member are adjusted using alignment marks, the solder bump can be formed on the electrode by the above-described various methods. According to this method, a solder bump can be formed only on a specific electrode. For example, the recess of the solder bump for g member is provided in advance at a position corresponding to the position of a specific electrode with respect to the plurality of electrodes on the surface of the base material, so that a solder bump can be formed only on the specific electrode on the base material surface. Further, one solder bump can be formed on one electrode.

The solder particle 1 which is extracted from the recess 62 but is not provided for bonding to the electrode 3 may be present on the obtained electrode substrate 20 provided with solder bumps. Therefore, the method for manufacturing an electrode substrate provided with solder bumps may further include a washing step of removing the solder particle 1 bonded to the electrode, after the removing step. Examples of a washing method include methods such as blowing of compressed air and rubbing of a substrate surface with a non-woven fabric or a fiber bundle.

According to the method for manufacturing an electrode substrate provided with solder bumps, the electrode substrate 20 provided with solder bumps including the substrate 2, the electrode 3, and the solder bump 1A in this order can be obtained.

<Method for Manufacturing Connection Structure>

Figure 7A:
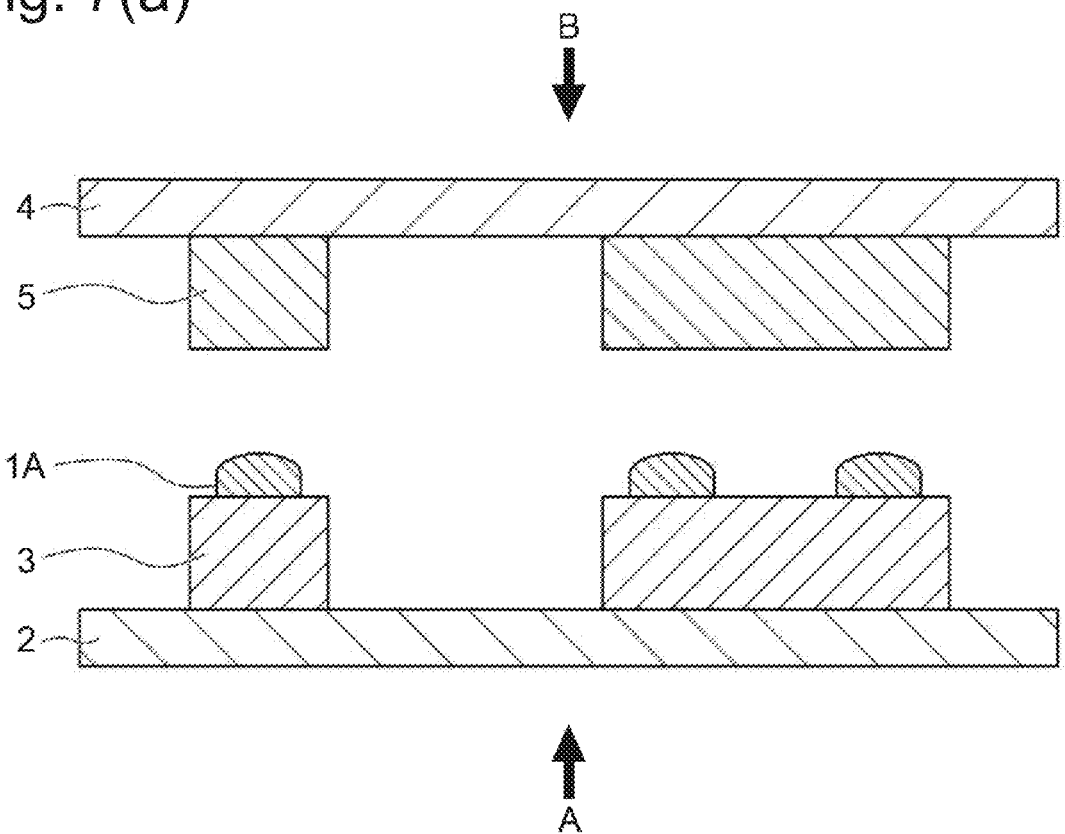
FIG. 7(a) and FIG. 7(b) are cross-sectional views schematically illustrating examples of manufacturing processes of a connection structure.
Figure 7B:
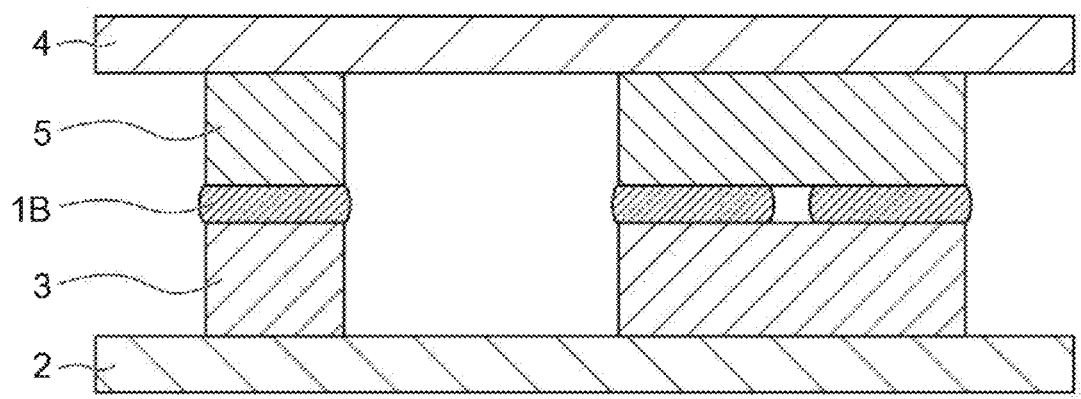

FIG. 7(a) and FIG. 7(b) are cross-sectional views schematically illustrating examples of manufacturing processes of a connection structure. The method for manufacturing a connection structure will be described with reference to FIG. 7(a) and FIG. 7(b). First, the electrode substrate 20 provided with solder humps illustrated in FIG. 6(b) is prepared in advance. Furthermore, another substrate 4 having a plurality of other electrodes 5 is prepared. Then, the electrode substrate 20 provided with solder bumps and the substrate 4 are disposed so that the solder bump 1A and the other electrode S face each other. Thereafter, while the solder bump 1A and the other electrode 5 are in contact with each other, at least heating is performed at a temperature (for example, 130° C. to 260° C.) higher than the melting point of the solder bump 1A, so that the solder bump 1A is melted between the electrode 3 and the other electrode 5. Thereafter, when the entirety is cooled, a solder layer 1B is formed between the electrode 3 and the other electrode 5 to electrically connect the electrodes to each other. in order to suppress oxidation of the solder bump 1A and the electrode 5, heating is preferably performed in an atmosphere in which oxygen is blocked. For example, heating in an inert gas atmosphere such as nitrogen is preferred. Specifically, a vacuum reflow furnace, a nitrogen reflow furnace, and the like can be used.

Further, in order to melt the solder bump 1A by heating and more suitably bond the electrode 3 and the electrode 5 facing each other, it is preferable to perform heating in a reducing atmosphere. In order to set a reducing atmosphere, hydrogen gas, hydrogen radical, formic acid, and the like can be used. Specifically a hydrogen reduction furnace, a hydrogen reflow furnace, a hydrogen radical furnace, a formic acid furnace, and a vacuum furnace, continuous furnace, or conveyor furnace of these can be used. By setting a reducing atmosphere, the oxide film on the surface of the solder bump 1A and the oxide film on the surface of the electrode 5 can be reduced and removed, so that the solder bump 1A is easily wet and spread to the electrode 5 and more stable bonding between the electrode 3 and the electrode 5 via the solder layer 1B is achieved.

Further, in order to realize stable connection, a pressure may be applied. The electrode substrate 20 provided with solder bumps illustrated in FIG. 6(b) is prepared in advance. Furthermore, the other substrate 4 having the plurality of other electrodes 5 on the surface thereof is prepared. Then, the electrode substrate 20 provided with solder bumps and the substrate 4 are disposed so that the solder bump 1A and the other electrode 5 face each other. Thereafter, a pressure is applied in a thickness direction of a laminate of these members (directions of arrow A and arrow B illustrated in FIG. 7(a)). When the pressure is applied, the entirety is subjected to at least heating at a temperature (for example, 130 to 260° C.) higher than the melting point of the solder bump 1A, so that the solder bump 1A is melted between the electrode 3 and the other electrode 5. Thereafter, when the entirety is cooled, a solder layer 1B is formed between the electrode 3 and the other electrode 5 to electrically connect the electrodes to each other. Also in this case, in order to suppress oxidation of the solder bump 1A and the surfaces of the electrode 5 and the electrode 3, the above-described step is preferably performed under vacuum, in an inert gas atmosphere such as nitrogen, or in a reducing atmosphere. Examples of the method for setting a reducing atmosphere include the hydrogen gas, hydrogen radical, and formic acid described above. Specifically, a hydrogen reduction furnace, a hydrogen reflow furnace, a hydrogen radical furnace, a formic acid furnace, a vacuum furnace, continuous furnace, or conveyor furnace of theses, and the like can be used.

As the method for setting a reducing atmosphere, a material having a reduction action can be used. For example, a flux material or a material containing a flux component can be disposed in the vicinity of the solder bump 1A or the electrode 5 and the electrode 3. A paste, film, or the like containing a flux material and a material containing a flux component can be used. First, the electrode substrate 20 provided with solder bumps illustrated in FIG. 6(b) is prepared in advance. A paste containing a flux material or a flux component is disposed on the entire surface of the electrode substrate 20 on which the solder bump 1A is formed or in the vicinity of the solder bump 1A and the electrode 3 including the solder bump 1A. Furthermore, the other substrate 4 having the plurality of other electrodes 5 on the surface thereof is prepared. Then, the electrode substrate 20 provided with solder bumps and the substrate 4 are disposed so that the solder bump 1A and the other electrode 5 face each other. Thereafter, while the solder bump 1A and the other electrode 5 are in contact with each other, for example, via a paste containing a flux material or a flux component, at least heating is performed at a temperature (for example, 130° C. to 260° C.) higher than the melting point of the solder bump 1A, so that the solder bump 1A is melted between the electrode 3 and the other electrode 5. Thereafter, when the entirety is cooled, a solder layer 1B is formed between the electrode 3 and the other electrode 5 to electrically connect the electrodes to each other. Thereafter, when the flux component is washed and removed, corrosion of the solder layer 1B, and the electrode 3 and the electrode 5 can be suppressed by the flux residue.

As another method, the electrode substrate 20 provided with solder bumps illustrated in FIG. 6(b) is prepared in advance. Furthermore, the other substrate 4 having the plurality of other electrodes 5 on the surface thereof is prepared, a paste containing a flux material or a flux component is disposed on the entire surface of the substrate 4 having the electrodes 5 or in the vicinity of the surface of the electrode 5. Then, the electrode substrate 20 provided with solder bumps and the substrate 4 are disposed so that the solder bump 1A and the other electrode 5 face each other. Thereafter, while the solder bump 1A and the other electrode 5 are in contact with each other, for example, via a paste containing a flux material and a flux component, at least heating is performed at a temperature (for example, 130° C. to 260° C.) higher than the melting point of the solder bump 1A, so that the solder bump 1A is melted between the electrode 3 and the other electrode 5. Thereafter, when the entirety is cooled, a solder layer 1B is formed between the electrode 3 and the other electrode 5 to electrically connect the electrodes to each other.

Furthermore, a film containing a flux component can also be used. The electrode substrate 20 provided with solder bumps illustrated in FIG. 6(b) is prepared in advance. The film containing a flux component is disposed on the surface side of the electrode substrate 20 on which the solder bump 1A is formed. Furthermore, the other substrate 4 having the plurality of other electrodes 5 on the surface thereof is prepared. Then, the electrode substrate 20 provided with solder bumps and the substrate 4 are disposed so that the solder bump 1A and the other electrode 5 face each other. Thereafter, while the solder bump 1A and the other electrode 5 are in contact with each other via the film containing a flux component, or in a state where the solder bump 1A and the other electrode 5 are in contact with each other by applying a pressure between the electrode 3 and the electrode 5 facing each other and pushing out the film containing a flux component from between the electrode 3 and the electrode 5, at least heating is performed at a temperature (for example, 130° C. to 260° C.) higher than the melting point of the solder bump 1A, so that the solder bump 1A is melted between the electrode 3 and the other electrode 5. Thereafter, when the entirety is cooled, a solder layer 1B is formed between the electrode 3 and the other electrode 5 to electrically connect the electrodes to each other.

The paste and film containing a flux component may contain a thermosetting material. As such, the thermosetting component is cured at the same time of the melting of the solder bump 1A, so that the electrode substrate 20 and the substrate 4 can be fixed to each other. The curing of the thermosetting material may be executed by heating again in the subsequent step, separately the melting and heating of the solder bump 1A. Furthermore, the film containing a flux component may be disposed and placed in advance on the surface side of the substrate 4 on which the electrode 5 is formed. The selection of the disposition position on whether the film containing a flux component is disposed on the solder bump 1A side or on the substrate 4 side having the electrode 5 can be appropriately made depending on the shape of the electrode, the shape and size of the solder bump 1A, the convenience of the bonding step, and the like.

As the method for manufacturing a connection structure, a method in which solder bonding and sealing between electrodes with a resin are simultaneously performed can also be employed. A connection structure can be obtained in the same manner as in the case of using the film containing a flux component, except that an insulating resin layer (resin film) is used instead of the film containing a flux component. As such, the electrode 3 and the other electrode 5 are connected to each other via the solder bump 1A, and the insulating resin layer is filled between the substrate 2 and the substrate 4. At this time, when the insulating resin layer is made of a material having thermosetting property, the substrate 2 and the substrate 4 are strongly fixed to each other, the electrode 3, the solder layer 1B, and the other electrode 5 are sealed, and corrosion and oxidation of the electrode and the solder due to moisture, oxygen, or the like can be suppressed, which is preferable.

Examples of the heating method for melting the solder bump 1A under vacuum include a method in which a heating plate in a reflow furnace is heated to transfer heat to the solder bump 1A through the substrate 2 and the substrate 4 that are in contact with the heating plate and a method using irradiation with infrared rays and the like.

Furthermore, in addition to or in combination with the heating method using the heating plate or the infrared rays described above, a method of heating the solder bump 1A through heated gaseous matter and gas can be used. Specifically, by heating inert gas and nitrogen, hydrogen, hydrogen radical, and formic acid, the solder bump 1A can be heated. The flux material and the flux component may contain at least one selected from the group consisting of succinic acid, glutaric acid, adipic acid, pimelic acid, suberic acid, benzoic acid, and malic acid.

As another method, a method using electromagnetic waves such as microwaves is exemplified. For example, specific electromagnetic waves by which components of the electrode 3. the electrode 5, and the solder bump 1A are heated can be applied from the outside. For example, in a case where the substrate 4 and the substrate 2 are a resin substrate, when the substrate 4 and the substrate 2 are irradiated with specific electromagnetic waves from the outside of the substrate 4 and the substrate 2, the electromagnetic waves are transmitted through the substrate 4 and the substrate 2, and the electrode 3 and the solder bump 1A or the electrode 5 is heated by the electromagnetic waves. in the case of this method, a portion which is desired to be bonded can be selectively heated, so that there is an advantage that extra thermal history does not remain. For example, even when the substrate 2 and the substrate 4 are made of a material having low heat resistance, the solder bump 1A is melted, so that the electrode 3 and the electrode 5 can be surely bonded to each other. Furthermore, since thermal history hardly remain in the entire system to be bonded, there is an advantage that warpage and decomposition after bonding are easily suppressed. Furthermore, in the case of using microwaves, since the solder bump 1A can be melted in a short time as compared to the case of using the heating plate, infrared rays, heating gas, and the like as described above, there is an advantage that thermal history remaining in the entire system, which is desired to be bonded, can be less, and the above-described effect is easily obtained. Further, when microwaves are used, only portions of the electrode 3, the solder bump 1A, and the electrode 5, which are desired to be bonded or incited, can be locally heated. Therefore, the entire system is not required to be heated, and even when there is something, such as a material having low heat resistance and another electronic component, to which heat is not desired to be applied, near the electrode 3 and the electrode 5, the solder bump 1A can be melted and bonded.

As another method, a method using ultrasonic waves is exemplified. For example, when an ultrasonic vibrator is disposed on the side opposite to the electrode 3 of the substrate 2 and ultrasonic waves are applied, the solder bump 1A is melted by vibration energy of ultrasonic waves. As such, the electrode 3 and the electrode 5, which has been disposed at a position facing the electrode 3 in advance, are bonded to each other via, the solder layer 1B. In the bonding by ultrasonic waves, since the solder bump 1A can be melted in a short time, the substrate 2 and the substrate 4 are not required to be entirely heated, and the electrode 3 and the electrode 5 can be surely bonded even in a case where the substrate 2 and the substrate 4 are made of a material having low heat resistance.

FIG. 7(b) is a schematic view of a connection structure 30 obtained in this way. That is, FIG. 7(b) schematically illustrates a state where the electrode 3 of the substrate 2 and the other electrode 5 of the other substrate 4 are connected to each other via the solder layer 1B formed by fusing. The term "fusing" in the present specification means a state. There at least a part of the electrode is bonded with solder (solder bump 1A) melted by heat, and then the solder is bonded to the surface of the electrode through the step of solidifying the solder. The connection structure 30 can include a first circuit member including a substrate and a plurality of electrodes on a surface thereof, a second circuit member including another substrate and a plurality of other electrodes on a surface thereof, and a solder layer between the plurality of electrodes and the plurality of other electrodes. Note that, a space between the first circuit member and the second circuit member can be filled, for example, with an underfill material containing an epoxy resin as a main agent.

Examples of targets to which the connection structure is applied include connecting portions of a semiconductor memory, a semiconductor logic chip, and the like, connecting portions of the first mounting and the second mounting of a semiconductor package, bonding bodies of a CMOS image element, a laser element, an LED light-emitting element, and the like, and devices such as a camera, a sensor, a liquid crystal display, a personal computer, a mobile phone, a smartphone, and a tablet that use these connecting portions and bonding bodies, Hereinbefore, the preferred embodiments of the present invention have been described; however, the present invention is not limited to the above-described embodiments.

EXAMPLES

Hereinafter, the present invention will be more specifically described by means of Examples; however, the present invention is not limited to these Examples.

<Production of Solder Bump Forming Film>

Production Example 1

Step a1: Classification of Solder Fine Particles 100 g of Sn—Bi solder fine particles (manufactured by 5N Plus, melting point: 139° C., Type 8) were immersed in distilled water, subjected to dispersion under ultrasonication, and left to stand still, and solder fine particles floating in the supernatant were recovered. This operation was repeated and 10 g of solder fine particles were recovered. The obtained solder fine particle has an average particle diameter of 1.0 μm and a C.V. value of 42%.

Step b1: Disposition on Base Substrate

A base substrate (polyimide film, thickness: 100 μm) having a plurality of recesses with an opening diameter of 2.3 φ, a bottom portion diameter of 2.0 μmφ, and a depth of 1.5 μm (the bottom portion diameter of 2.0 μmφ is positioned at the center of the opening diameter of 2.3 μmφ when the opening is viewed from the upper surface) as shown in Table 1 was prepared. The plurality of recesses were regularly arranged with an interval of 1.0 μm. The solder fine particles obtained in the step a (average particle diameter: 1.0 μm, C.V. value: 42%) were disposed in the recesses of the base substrate. Note that, excessive solder fine particles were removed by rubbing, with a low-adhesion roller, the surface side of the base substrate on which the recesses are formed, thereby obtaining the base substrate in which the solder fine particles are disposed only in the recesses.

Step c1: Formation of Solder Particle

The base substrate in which the solder fine particles are disposed in the recesses in the step b 1 was put in a hydrogen reduction furnace (manufactured by SHINKO SEIM CO., LTD., vacuum soldering device), subjected to vacuuming, and then hydrogen gas was introduced into the furnace to fill hydrogen in the furnace. Thereafter, after the inside the furnace was maintained at 280° C. for 20 minutes, vacuuming was then performed again, nitrogen was introduced into the furnace, and the pressure in the furnace was returned to an atmospheric pressure, the temperature in the furnace was decreased to room temperature to form solder particles. A solder bump forming film having the solder particles in the recesses was obtained.

<Evaluation of Solder Bump Forming Film>

A part of the solder bump forming film obtained through the step c1 was fixed on an SEM observation stage surface and the surface was subjected to platinum sputtering. The diameters of 300 solder particles were measured with an SEM to calculate an average particle diameter and a CV value. The results are shown in Table 2.

Furthermore, the surface shape of a part of the solder bump forming film obtained through the step c1 was measured using a laser microscope (manufactured by Olympus Corporation, LEXT OLS5000-SAF), and the height of the solder particle from the base substrate surface was measured to calculate an average value of heights of 300 solder particles. The results are shown in Table 2.

Production Examples 2 to 6

Solder bump forming film were produced and evaluated in the same manner as in Production Example 1, except that the recess size and the like were changed as described in Table 1. The results are shown in Table 2.

Production Example 7

A solder bump forming film was produced and evaluated in the same manner as in Production Example 1, except that the following step c2 was performed instead of the step c1. The results are shown in Table 2.

Step c2: Formation of Solder Particle

The base substrate in which the solder fine particles are disposed in the recesses in the step b 1 was charged in a hydrogen radical reduction furnace (manufactured by SHINKO SEIKI CO., LTD., plasma reflow device), subjected to vacuuming, and then hydrogen gas was introduced into the furnace to fill the hydrogen gas in the furnace. Thereafter, the inside of the furnace was adjusted to 120° C. and irradiation with hydrogen radicals was performed for 5 minutes. Thereafter, after the hydrogen gas in the furnace was removed by vacuuming, the furnace was then heated to 170° C., nitrogen was introduced into the furnace, and the pressure in the furnace was returned to an atmospheric pressure, the temperature in the furnace was decreased to room temperature to form solder particles, A solder bump forming film having the solder particles in the recesses was obtained.

Production Examples 8 to 12

Solder bump forming films were produced and evaluated in the same manner as in Production Example 7, except that the recess size and the like were changed as described in Table 1, The results are shown in Table 2.

Production Example 13

A solder bump forming film was produced and evaluated in the same manner as in Production Example 1, except that the following step c3 was performed instead of the step c1. The results are shown in Table 2.

Step c3: Formation of Solder Particle

The base substrate in which the solder fine particles are disposed in the recesses in the step b1 was charged in a formic acid reduction furnace, subjected to vacuuming, and then formic acid gas was introduced into the furnace to fill the formic acid gas in the furnace. Thereafter, the inside of the furnace was adjusted to 130° C., and this temperature was maintained for 5 minutes. Thereafter, after the formic acid gas in the furnace was removed by vacuuming, the furnace was then heated to 180° C., nitrogen was introduced into the furnace, and the pressure in the furnace was returned to an atmospheric pressure, the temperature in the furnace was decreased to room temperature to form solder particles. A solder bump forming film having the solder particles in the recesses was obtained.

Production Examples 14 to 18

Solder bump forming films were produced and evaluated in the same manner as in Production Example 13, except that the recess size and the like were changed as described in Table 1. The results are shown in Table 2.

Production Example 9

A solder bump forming film was produced and evaluated in the same manner as in Production Example 1, except that the following step c4 was performed instead of the step c1. The results are shown in Table 2.

Step c4: Formation of Solder Particle

The base substrate in which the solder fine particles are disposed in the recesses in the step b 1 was charged in a formic acid conveyor reflow furnace (manufactured by Heller Industries, Inc., 1913MK), and the base substrate was continuously passed through a nitrogen zone, a. nitrogen and formic acid gas mixed zone, and a nitrogen zone which were adjusted to 190° C., while being conveyed by a conveyor. The base substrate was passed through the nitrogen and formic acid gas mixed zone for 20 minutes to form a solder bump forming film.

Production Examples 20 to 24

Solder bump forming films were produced and evaluated in the same manner as in Production Example 19, except that the recess size and the like were changed as described in Table 1, The results are shown in Table 2.

TABLE 1

|  |  | Production Example 1 | Production Example 2 | Production Example 3 | Production Example 4 | Production Example 5 | Production Example 6 |
|---|---|---|---|---|---|---|---|
| Opening diameter | μm | 2.3 | 4.3 | 6.3 | 18 | 24 | 35 |
| Bottom portion diameter | μm | 2 | 4 | 6 | 16 | 22 | 33 |
| Depth | μm | 1.5 | 3 | 4.5 | 12 | 16.5 | 25 |
| Interval | μm | 1 | 2.3 | 4.6 | 8.6 | 11.5 | 17 |

|  |  | Production Example 7 | Production Example 8 | Production Example 9 | Production Example 10 | Production Example 11 | Production Example 12 |
|---|---|---|---|---|---|---|---|
| Opening diameter | μm | 2.3 | 4.3 | 6.3 | 18 | 24 | 35 |
| Bottom portion diameter | μm | 2 | 4 | 6 | 16 | 22 | 33 |
| Depth | μm | 1.5 | 3 | 4.5 | 12 | 16.5 | 25 |
| Interval | μm | 1 | 2.3 | 4.6 | 8.6 | 11.5 | 17 |

|  |  | Production Example 13 | Production Example 14 | Production Example 15 | Production Example 16 | Production Example 17 | Production Example 18 |
|---|---|---|---|---|---|---|---|
| Opening diameter | μm | 2.3 | 4.3 | 6.3 | 18 | 24 | 35 |
| Bottom portion diameter | μm | 2 | 4 | 6 | 16 | 22 | 33 |
| Depth | μm | 1.5 | 3 | 4.5 | 12 | 16.5 | 25 |
| Interval | μm | 1 | 2.3 | 4.6 | 8.6 | 11.5 | 17 |

TABLE 1-continued

|  |  | Production Example 19 | Production Example 20 | Production Example 21 | Production Example 22 | Production Example 23 | Production Example 24 |
|---|---|---|---|---|---|---|---|
| Opening diameter | μm | 2.3 | 4.3 | 6.3 | 18 | 24 | 35 |
| Bottom portion diameter | μm | 2 | 4 | 6 | 16 | 22 | 33 |
| Depth | μm | 1.5 | 3 | 4.5 | 12 | 16.5 | 25 |
| Interval | μm | 1 | 2.3 | 4.6 | 8.6 | 11.5 | 17 |

TABLE 2

|  |  | Production Example 1 | Production Example 2 | Production Example 3 | Production Example 4 | Production Example 5 | Production Example 6 |
|---|---|---|---|---|---|---|---|
| Average particle diameter | μm | 2.3 | 4.2 | 6.1 | 17.5 | 23.4 | 34.3 |
| C.V. value | % | 19.0 | 7.5 | 6.6 | 4.3 | 3.9 | 3.3 |
| Height | μm | 0.8 | 1.2 | 1.6 | 5.5 | 6.9 | 9.3 |

|  |  | Production Example 7 | Production Example 8 | Production Example 9 | Production Example 10 | Production Example 11 | Production Example 12 |
|---|---|---|---|---|---|---|---|
| Average particle diameter | μm | 2.2 | 4.1 | 6.0 | 16.3 | 23.1 | 33.3 |
| C.V. value | % | 18.8 | 7.6 | 6.5 | 4.1 | 3.7 | 3.1 |
| Height | μm | 0.7 | 1.1 | 1.5 | 4.3 | 6.6 | 8.3 |

|  |  | Production Example 13 | Production Example 14 | Production Example 15 | Production Example 16 | Production Example 17 | Production Example 18 |
|---|---|---|---|---|---|---|---|
| Average particle diameter | μm | 2.3 | 4.3 | 6.1 | 17.1 | 23.4 | 34.3 |
| C.V. value | % | 19.2 | 7.5 | 6.6 | 4.3 | 3.9 | 3.3 |
| Height | μm | 0.8 | 1.2 | 1.6 | 5.1 | 6.9 | 9.3 |

|  |  | Production Example 19 | Production Example 20 | Production Example 21 | Production Example 22 | Production Example 23 | Production Example 24 |
|---|---|---|---|---|---|---|---|
| Average particle diameter | μm | 2.2 | 4.2 | 5.9 | 17.5 | 23.0 | 33.7 |
| C.V. value | % | 19.5 | 7.8 | 6.5 | 4.5 | 3.9 | 3.0 |
| Height | μm | 0.7 | 1.2 | 1.4 | 5.5 | 6.9 | 8.7 |

<Production of Evaluation Chip Provided with Solder Bumps>

Step d1: Preparation of Evaluation Chip

Seven kinds of chips provided with gold bumps 3.0×3 0 mm, thickness: 0.5 mm) described below were prepared.

Chip C1 area: 100 μm×100 μm, space: 40 μm, height: 10 μm, number of bumps: 362

Chip C2 area: 75 μm×75 μm, space: 20 μm, height: 10 μm, number of bumps: 362

Chip C3 area: 40 μm×40 μm, space: 16 μm, height: 7 μm, number of bumps: 362

Chip C4 area: 20 μm x 20 μm, space: 7 μm, height: 5 μm, number of bumps: 362

Chip C5 area: 10 μm x 10 μm, space: 6 μm, height: 3 μm, number of bumps: 362

Chip C6 area: 10 μm×10 μm, space: 4 μm, height: 3 μm, number of bumps: 362

Chip C7 area: 5 μm×10 μm, space: 3 μm, height: 2 μm, number of bumps: 362

Step e1: Solder Bump Formation

According to the following procedures i) to iii), the solder bump limning film (Production Example 7) produced in the step c2 was used, and solder bumps were formed on a chip provided with gold bumps (3.0×3.0 mm, thickness: 0.5 mm)

i) A glass plate having a thickness of 0.3 mm was placed on the lower hot plate of a formic acid fellow furnace (manufactured by SHINKO SEIKI CO., LID., batch-type vacuum soldering device) and the evaluation chip was placed on the glass plate such that the gold bump faced upward.

ii) The surface of the solder bump forming film on which the solder particles are exposed faced downward, and the gold bump surface of the evaluation chip and the solder particles were disposed to be in contact with each other. Further, a glass plate having a thickness of 0.3 mm was placed on the solder bump forming film, and the solder particles were in close contact with the gold bumps.

iii) A formic acid vacuum reflow furnace was operated, vacuuming was performed, formic acid gas was then filled in the surface, the lower hot plate was heated to 150° C., and heating was performed for 5 minutes. Thereafter, the formic acid gas was discharged by vacuuming, nitrogen substitution was then performed, the lower hot plate was returned to room temperature, and the inside of the furnace was opened to the atmosphere. The uppermost glass plate and the solder bump forming film were removed in this order to obtain an evaluation chip provided with solder bumps.

<Evaluation of Solder Bump>

The evaluation chip obtained through the step e1 was fixed on an SEM observation stage surface and the surface was subjected to platinum sputtering. For 30 gold bumps, the number of solder humps placed on the gold bump was counted with an SEM, and the average number of gold bumps placed on one gold bump was calculated, The results are shown in Table 3. Furthermore, the height of the solder bump from the gold bump was measured using a laser microscope (manufactured by Olympus Corporation, LEXT OLS5000-SAF), and an average value of heights of 100 solder bumps was calculated. The results are shown in Table 3.

Solder bumps were performed by the same method as described above, except that the solder bump forming films of Production Examples 8 to 12 were used instead of the solder bump forming film of Production Example 7. The evaluation results are shown in Table 3.

Figure 8A:
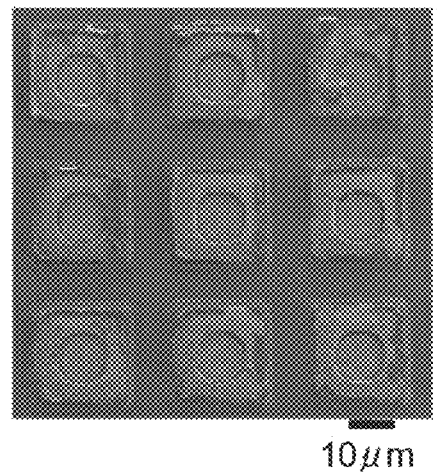
FIG. 8(a) is an SEM image Obtained by capturing some of gold bumps of Chip C4.
Figure 8B:
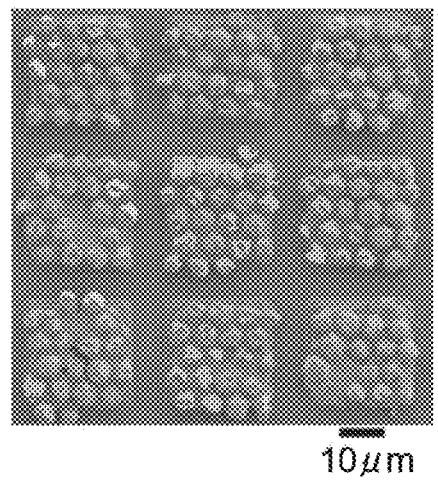
FIG. 8(b) is an SEM image obtained after solder bumps were formed on the gold bumps of Chip C4 using the solder bump forming member of Production Example 8.

FIG. 8(a) is an SEM image obtained by capturing some of gold bumps of Chip C4. FIG. 8(b) is an SEM image obtained after solder bumps were formed on the gold bumps of Chip C4 using the solder bump forming film of Production Example 8. Solder bumps are formed only on the solder bumps, and a solder material derived from solder particles and solder bumps is not observed between the gold bumps.

SHINKO SEAM CO., LTD., batch-type vacuum soldering device) such that the gold bumps faced upward.

ii) The solder bump surface of the evaluation chip on which the solder bumps are formed faced downward, the gold bump surface of the evaluation substrate and the solder bumps were disposed to be in contact with each other and were fixed to each other so as not to be moved.

iii) A formic acid vacuum reflow furnace was operated, vacuuming was performed, formic acid gas was then filled in the furnace, the lower hot plate was heated to 180° C., and heating was performed for 5 minutes. Thereafter, the formic acid gas was discharged by vacuuming, nitrogen substitution was then performed, the lower hot plate was returned to room temperature,

TABLE 3

| Chip | Solder bump forming film | | Production Example 7 | Production Example 8 | Production Example 9 | Production Example 10 | Production Example 11 | Production Example 12 |
|---|---|---|---|---|---|---|---|---|
| C1 | Number of bumps on electrode | Number | 1285.0 | 330.6 | 99.5 | 20.3 | 10.7 | 4.8 |
| | Height average | μm | 1.9 | 3.8 | 5.5 | 15.0 | 20.2 | 30.7 |
| C2 | Number of bumps on electrode | Number | 735.5 | 229.7 | 57.4 | 11.8 | — | — |
| | Height average | μm | 1.9 | 3.8 | 5.5 | 15.0 | — | — |
| C3 | Number of bumps on electrode | Number | 201.3 | 54.2 | 16.9 | — | — | — |
| | Height average | μm | 1.9 | 3.8 | 5.5 | — | — | — |
| C4 | Number of bumps on electrode | Number | 49.3 | 12.7 | 3.9 | — | — | — |
| | Height average | μm | 1.9 | 3.8 | 5.5 | — | — | — |
| C5 | Number of bumps on electrode | Number | 12.8 | 3.9 | — | — | — | — |
| | Height average | μm | 1.9 | 3.8 | — | — | — | — |
| C6 | Number of bumps on electrode | Number | 12.8 | — | — | — | — | — |
| | Height average | μm | 1.9 | — | — | — | — | — |
| C7 | Number of bumps on electrode | Number | 2.9 | — | — | — | — | — |
| | Height average | μm | 1.9 | — | — | — | — | — |

<Production of Connection Structure>

Step f1: Preparation of Evaluation Substrate

Seven kinds of substrates provided with gold bumps (70×25 mm, thickness: 0.5 mm) described below were prepared. Note that, lead-out wires for resistance measurement are formed on these gold bumps.

Substrate D1 area: 100 μm×100 μm, space: 40 μm, height: 4 μm, number of bumps: 362

Substrate D2 area: 75 μm×75 μm, space: 20 μm, height: 4 μm, number of bumps: 362

Substrate D3 area: 40 μm×40 μm, space: 16 μm, height: 4 μm, number of bumps: 362

Substrate D4 area: 20 μm×20 μm, space: 7 μm, height: 4 μm, number of bumps: 362

Substrate D5 area: 10 μm×10 urn, space: 6 μm, height: 3 μm, number of bumps: 362

Substrate D6 area: 10 μm×10 μm, space: 4 μm, height: 3 μm, number of bumps: 362

Substrate D7 area: 5 μm×10 μm, space: 3 μm, height: 3 μm, number of bumps: 362

Step g1: Bonding of Electrode

According to the following procedures i) to iii), the evaluation chip provided with solder bumps produced in the step e1 was used, and an evaluation substrate provided with gold bumps and the evaluation chip were connected to each other via solder humps.

i) The evaluation substrate was placed on a lower hot plate of a formic acid reflow furnace (manufactured by and the inside of the furnace was opened to the atmosphere. An appropriate amount of an underfill material (manufactured by Hitachi Chemical Co., Ltd., CEL series) with a viscosity adjusted was put between the evaluation chip and the evaluation substrate and filled therebetween by vacuuming, and then the material was cured at 125° C. for 3 hours to produce a connection structure between the evaluation chip and the evaluation substrate. Combinations of respective materials in the connection structure are as described below.

(1) Chip C1/Solder bump forming film/Substrate D1
(2) Chip C2/Solder bump forming film/Substrate D2
(3) Chip C3/Solder bump forming film/Substrate D3
(4) Chip (C4/Solder bump forming film/Substrate D4
(5) Chip C5/Solder bump forming film/Substrate D5
(6) Chip C6/Solder bump forming film/Substrate D6
(7) Chip C7/Solder bump forming film/Substrate D7

<Evaluation of Connection Structure>

For a part of the obtained connection structure, a conductive resistance test and an insulation resistance test were performed as described below.

(Conductive Resistance Test-Moisture Absorption and Heat Resistance Test)

As for the conductive resistance between the chip provided with gold bumps (bumps)/the substrate provided with gold bumps (humps), initial values of the conductive resistance and values after a moisture absorption and heat resistance test (exposure for 100, 500, and 1000 hours under the conditions of a temperature of 85° C. and a humidity of 85%) were measured for 20 samples, and an average value of these values was calculated.

The conductive resistance was evaluated from the obtained average value according to the following criteria. The results are shown in Table 4. Note that, a case satisfying the following criterion A or B after 1000 hours of the moisture absorption and heat resistance test is determined that the conductive resistance is favorable.
- A: The average value of conductive resistance is less than 2 Ω.
- B: The average value of conductive resistance is 2Ω or more and less than 5 Ω.
- C: The average value of conductive resistance is 5Ω or more and less than 10 Ω.
- D: The average value of conductive resistance is 10Ω or more and less than 20 Ω.
- E: The average value of conductive resistance is 20Ω or more.

(Conductive Resistance Test-High-Temperature Exposure Test)

As for the conductive resistance between the chip provided with gold bumps (bumps)/the substrate provided with gold bumps (bumps), initial values of the conductive resistance and values after a high-temperature exposure test (exposure for 100, 500, and 1000 hours under the condition of a temperature of 100° C.) were measured for 20 samples. Note that, after high-temperature exposure, dropping impact was applied, and the conductive resistance of the sample after the dropping impact was measured. The dropping impact was generated by fixing a connection structure to a metal plate with screws and dropping the connection structure from a height of 50 cm. After the dropping, a DC resistance value in a solder bonding portion (four places) at a chip corner having the largest impact was measured, the breakage was regarded to occur when the measured value was increased five times or more from the initial resistance, and the evaluation was performed. Note that, measurement was performed at four places for each sample, that is, 80 places in total. The results are shown in Table 5. A case satisfying the following criterion A or B after the number of times of dropping was 20 was evaluated that the solder connection reliability is favorable.
- A: The number of solder connecting portions with the measured value was increased five times or more from the initial resistance was 0.
- B: The number of solder connecting portions with the measured value was increased five times or more from the initial resistance was 1 or more and 5 or less.
- C: The number of solder connecting portions with the measured value was increased five times or more from the initial resistance was 6 or more and 20 or less.
- D: The number of solder connecting portions with the measured value was increased five times or more from the initial resistance was 21 or more.

(Insulation Resistance Test)

As for the insulation resistance between the chip electrodes, initial values of the insulation resistance and values after a migration test (exposure for 100, 500, and 1000 hours under the conditions of a temperature of 60° C., a humidity of 90%, and an application voltage of 20 V) were measured for 20 samples, and the proportion of samples having an insulation resistance value of $10^9 \Omega$ or more among the total 20 samples was calculated. The insulation resistance was evaluated from the obtained proportion according to the following criteria. The results are shown in Table 6. Note that, a case satisfying the following criterion A or B after 1000 hours of the migration test is determined that the insulation resistance is favorable.
- A: The proportion of samples having an insulation resistance value of $10^9 \Omega$ or more is 100%.
- B: The proportion of samples having an insulation resistance value of $10^9 \Omega$ or more is 90% or more and less than 100%.
- C: The proportion of samples having an insulation resistance value of $10^9 \Omega$ or more is 80% or more and less than 90%.
- D: The proportion of samples having an insulation resistance value of $10^9 \Omega$ or more is 50% or more and less than 80%.
- E: The proportion of samples having an insulation resistance value of $10^9 \Omega$ or more is less than 50%.

TABLE 4

| | | Connection structure | Solder bump forming film | Production Example 7 | Production Example 8 | Production Example 9 | Production Example 10 | Production Example 11 | Production Example 12 |
|---|---|---|---|---|---|---|---|---|---|
| Conductive resistance | Moisture absorption and heat resistance test | (1) | Initial | A | A | A | A | A | A |
| | | | After 100 hours | A | A | A | A | A | A |
| | | | After 500 hours | A | A | A | A | A | A |
| | | | After 1000 hours | B | B | B | B | A | A |
| | | (2) | initial | A | A | A | A | | |
| | | | After 100 hours | A | A | A | A | | |
| | | | After 500 hours | B | B | A | A | | |
| | | | After 1000 hours | B | B | B | B | | |
| | | (3) | Initial | A | A | A | | | |
| | | | After 100 hours | B | A | A | | | |
| | | | After 500 hours | B | B | B | | | |
| | | | After 1000 hours | B | B | B | | | |
| | | (4) | Initial | A | A | | | | |
| | | | After 100 hours | B | A | | | | |
| | | | After 500 hours | B | B | | | | |
| | | | After 1000 hours | B | B | | | | |
| | | (5) | Initial | A | A | | | | |
| | | | After 100 hours | B | A | | | | |
| | | | After 500 hours | B | B | | | | |
| | | | After 1000 hours | B | B | | | | |
| | | (6) | initial | A | | | | | |
| | | | After 100 hours | B | | | | | |
| | | | After 500 hours | B | | | | | |
| | | | After 1000 hours | B | | | | | |

TABLE 4-continued

| Connection structure | Solder bump forming film | Production Example 7 | Production Example 8 | Production Example 9 | Production Example 10 | Production Example 11 | Production Example 12 |
|---|---|---|---|---|---|---|---|
| (7) | Initial | A | | | | | |
|  | After 100 hours | B | | | | | |
|  | After 500 hours | B | | | | | |
|  | After 1000 hours | B | | | | | |

TABLE 5

| | | Connection structure | Solder bump forming film | Production Example 7 | Production Example 8 | Production Example 9 | Production Example 10 | Production Example 11 | Production Example 12 |
|---|---|---|---|---|---|---|---|---|---|
| Conductive resistance | High-temperature exposure test | (1) | Initial | A | A | A | A | A | A |
| | | | After 100 hours | A | A | A | A | A | A |
| | | | After 500 hours | A | A | A | A | A | A |
| | | | After 1000 hours | B | B | B | B | A | A |
| | | (3) | Initial | A | A | A | | | |
| | | | After 100 hours | B | A | A | | | |
| | | | After 500 hours | B | B | B | | | |
| | | | After 1000 hours | B | B | B | | | |
| | | (6) | Initial | A | | | | | |
| | | | After 100 hours | A | | | | | |
| | | | After 500 hours | B | | | | | |
| | | | After 1000 hours | B | | | | | |

TABLE 6

| | | Connection structure | Solder bump forming film | Production Example 7 | Production Example 8 | Production Example 9 | Production Example 10 | Production Example 11 | Production Example 12 |
|---|---|---|---|---|---|---|---|---|---|
| Insulation resistance | Moisture absorption and heat resistance test | (1) | Initial | A | A | A | A | A | A |
| | | | After 100 hours | A | A | A | A | A | A |
| | | | After 500 hours | A | A | A | A | A | A |
| | | | After 1000 hours | A | A | A | A | A | B |
| | | (2) | Initial | A | A | A | A | | |
| | | | After 100 hours | A | A | A | A | | |
| | | | After 500 hours | A | A | A | A | | |
| | | | After 1000 hours | A | A | A | B | | |
| | | (3) | Initial | A | A | A | | | |
| | | | After 100 hours | A | A | A | | | |
| | | | After 500 hours | A | A | A | | | |
| | | | After 1000 hours | A | A | B | | | |
| | | (4) | Initial | A | A | | | | |
| | | | After 100 hours | A | A | | | | |
| | | | After 500 hours | A | A | | | | |
| | | | After 1000 hours | A | A | | | | |
| | | (5) | Initial | A | A | | | | |
| | | | After 100 hours | A | A | | | | |
| | | | After 500 hours | A | A | | | | |
| | | | After 1000 hours | A | B | | | | |
| | | (6) | Initial | A | | | | | |
| | | | After 100 hours | A | | | | | |
| | | | After 500 hours | A | | | | | |
| | | | After 1000 hours | A | | | | | |
| | | (7) | Initial | A | | | | | |
| | | | After 100 hours | A | | | | | |
| | | | After 500 hours | A | | | | | |
| | | | After 1000 hours | B | | | | | |

<Production of Solder Bump Forming Film>

Production Example 25

Step h1: Production of Base Substrate

A liquid photosensitive resist (manufactured by Hitachi Chemical Co., Ltd., AH series) was applied onto a 6-inch silicon wafer by a spin coating method to have a thickness of 1.5 μm. The photosensitive resist on the silicon wafer was exposed and developed to obtain a base substrate 25 having recesses with an opening diameter of 3.1 μmϕ, a bottom portion diameter of 2.0 μmϕ, and a depth of 1.5 μm (the bottom portion diameter of 2.0 μmo is positioned at the center of the opening diameter of 2.3 μmϕ when the opening is viewed from the upper surface). Note that, these recesses were disposed at positions (X-direction pitch and Y-direction pitch) corresponding to the electrode disposition pattern of the evaluation substrate. Furthermore, three alignment marks were disposed on the surface of the base substrate 25 at the same time of the recess formation. The outline of the base substrate 25 is shown in Table 7.

TABLE 7

|  |  | Production Example 25 Base substrate 25 | Production Example 26 Base substrate 26 | Production Example 27 Base substrate 27 | Production Example 28 Base substrate 28 | Production Example 29 Base substrate 29 | Production Example 30 Base substrate 30 |
|---|---|---|---|---|---|---|---|
| Opening diameter | μm | 3.1 | 6.3 | 8.4 | 21 | 29 | 43 |
| Bottom portion diameter | μm | 2 | 4 | 6 | 16 | 22 | 33 |
| Depth | μm | 1.5 | 3 | 4.5 | 12 | 16.5 | 25 |
| X-direction pitch | μm | 16 | 32 | 48 | 144 | 192 | 280 |
| Y-direction pitch | μm | 8 | 16 | 24 | 72 | 96 | 140 |

Solder fine particles were obtained in the same manner as in the step a1, the solder fine particles were disposed in the recesses in the same manner as in the step b1 except that the base substrate 25 was used, and a solder bump forming film 25 having solder particles in the recesses was obtained by the step c3.

<Evaluation of Solder Bump Forming Film>

A part of the solder bump forming film 25 was fixed on an SEM observation stage surface and the surface was subjected to platinum sputtering. The diameters of 300 solder particles were measured with an SEM to calculate an average particle diameter and a C.V. value. The results are shown in Table 8. Furthermore, the surface shape of a part of the solder bump forming film 25 was measured using a laser microscope (manufactured by Olympus Corporation, LEXT OLS5000-SAF), and the height of the solder particle from the base substrate surface was measured to calculate an average value of heights of 300 solder particles. The results are shown in Table 8.

TABLE 8

|  |  | Production Example 25 | Production Example 26 | Production Example 27 | Production Example 28 | Production Example 29 | Production Example 30 |
|---|---|---|---|---|---|---|---|
| Average particle diameter | μm | 2.1 | 4.0 | 6.1 | 15.9 | 21.0 | 32.0 |
| C.V. value | % | 18.0 | 7.5 | 6.9 | 4.7 | 4.0 | 3.4 |
| Height | μm | 0.6 | 1.0 | 1.6 | 3.9 | 4.5 | 7.0 |

Production Examples 26 to 30

A solder bump forming film was produced and evaluated in the same manner as in Production Example 25, except that the thickness of the photosensitive resist was changed to the depth value shown in Table 7, the recess size was also changed as shown in Table 7, and the recess disposition position was set to a position corresponding to electrode disposition pattern of the evaluation substrate described in Table 7.

The results are shown in Table 8.

<Production of Evaluation Chip Provided with Solder Bumps>

Step d2: Preparation of Evaluation Chip

Six kinds of chips provided with gold bumps (5×5 mm, thickness: 0.5 mm) described below were prepared.

Chip C8 electrode size: 8 μm×4 μm, pitch: X direction 16 μm, Y direction 8 μm, number of bumps: 180000

Chip C9 electrode size: 16 μm×8 μm, pitch: X direction 32 μm, Y direction 16 μm, number of bumps: 46000

Chip C10 electrode size: 24 μm×12 μm, pitch: X direction 48 μm, Y direction 24 μm, number of bumps: 15000

Chip C11 electrode size: 72 μm×36 μm, pitch: X direction 144 μm, Y direction 72 μm, number of bumps: 3400

Chip C12 electrode size: 96 μm×48 μm, pitch: X direction 192 μm, Y direction 96 μm, number of bumps: 850

Chip C13 electrode size: 140 μm×70 μm, pitch: X direction 280 μm, Y direction 140 μm, number of bumps: 420

Step e2: Solder Bump Formation

The solder bump forming film 25 was placed on the stage of FC3000W (manufactured by Toray Engineering Co., Ltd.), Evaluation Chip C8 was mounted on the head and then picked up, the positioning between the solder particle disposed in the recess of the solder bump forming film 25 and the electrode of Evaluation Chip C8 was performed using alignment marks on both of them, and Evaluation Chip C8 was temporally placed on the solder bump forming film 25. Thereafter, the evaluation chip was placed on the lower hot plate of a formic acid reflow furnace (manufactured by SHINKO SEIKI CO., LTD., batch-type vacuum soldering device), vacuuming was performed, formic acid gas was then filled in the furnace, the lower hot plate was heated to 145° C., and heating was performed for 1 minute. Thereafter, the formic acid gas was discharged by vacuuming, nitrogen substitution was then performed, the lower hot plate was returned to room temperature, the inside of the furnace was opened to the atmosphere, and the solder particles were transferred onto the electrodes of Evaluation Chip C8 to form solder bumps.

<Evaluation of Solder Bump>

For the evaluation chip obtained through the step e2, the number of solder particles which could be transferred to 300 electrodes (the number of solder bumps) was counted to calculate a transfer rate. Furthermore, the height of the solder hump was measured using a laser microscope (manufactured by Olympus Corporation, LEXT OLS5000-SAF), and an average value of heights of 300 solder particles was calculated. The results are shown in Table 9.

TABLE 9

| | | | Production Example 25 | Production Example 26 | Production Example 27 | Production Example 28 | Production Example 29 | Production Example 30 |
|---|---|---|---|---|---|---|---|---|
| C8 | Transfer rate | % | 99.98 | — | — | — | — | — |
| | Height average | μm | 1.5 | — | — | — | — | — |
| C9 | Transfer rate | % | — | 99.99 | — | — | — | — |
| | Height average | μm | — | 2.9 | — | — | — | — |
| C10 | Transfer rate | % | — | — | 99.99 | — | — | — |
| | Height average | μm | — | — | 4.5 | — | — | — |
| C11 | Transfer rate | % | — | — | — | 100.00 | — | — |
| | Height average | μm | — | — | — | 11.8 | — | — |
| C12 | Transfer rate | % | — | — | — | — | 100.00 | — |
| | Height average | μm | — | — | — | — | 16.5 | — |
| C13 | Transfer rate | % | — | — | — | — | — | 100.00 |
| | Height average | μm | — | — | — | — | — | 25.0 |

The solder bump formation was performed in the same manner as in the step e2, except that the solder bump forming films 26 to 30 and Evaluation Chips C9 to C13 were used. Further, the transfer rate and the height average value of each evaluation chip were calculated in the same manner as described above. The results are shown in Table 9.

<Production of Connection Structure>

Six kinds of evaluation substrates provided with gold bumps (70×25 mm, thickness: 0.5 mm) described below were prepared. The gold bumps are disposed at positions corresponding to gold electrodes of Evaluation Chips C8 to C13 described above, and alignment marks are disposed on the substrates. Furthermore, lead-out wires for resistance measurement are formed on some of the gold bumps.

Substrate D8 area: 8 μm×4 μm, pitch: X direction 16 μm, Y direction 8 μm, height: 2 μm, number of bumps: 180000

Substrate D9 area: 16 μm×8 μm, pitch: X direction 32 μm, Y direction 16 μm, height: 3 μm, number of bumps: 46000

Substrate D10 area: 24 μm×12 μm., pitch: X direction 48 μm, Y direction 24 μm, height: 3 μm, number of bumps: 15000

Substrate D11 area: 72 μm×36 μm, pitch: X direction 144 μm, Y direction 72 μm, height: 3 μm, number of bumps: 3400

Substrate D12 area: 96 μm×48 μm, pitch: X direction 192 μm, Y direction 96 μm, height: 3 μm, number of bumps: 850

Substrate D13 area: 140 μm×70 μm, pitch: X direction 280 μm, direction 140 μm, height: 3 μm, number of bumps: 420

Step g2: Bonding of Electrode

According to the following procedures i) to iii), the evaluation chip provided with solder bumps produced in the step e2 was used, and an evaluation substrate provided with gold bumps and the evaluation chip were connected to each other via solder bumps.

i) Evaluation Substrate D8 provided with gold bumps was placed on the stage of FC3000W (manufactured by Toray Engineering Co., Ltd.), Evaluation Chip C8 provided with solder bumps was picked up at the head, the gold electrodes faced each other using alignment marks on both of them, and Evaluation Chip C8 provided with solder bumps was disposed on Evaluation Substrate D8 provided with gold bumps to obtain a pre-bonded sample 8.

ii) The pre-bonded sample 8 obtained in i) was placed on a lower hot plate of a formic acid reflow furnace (manufactured by SHINKO SEIKI CO., LTD., batch-type vacuum soldering device).

iii) A formic acid vacuum reflow furnace was operated, vacuuming was performed, formic acid gas was then filled in the furnace, the lower hot plate was heated to 160° C., and heating was performed for 5 minutes. Thereafter, the formic acid gas was discharged by vacuuming, nitrogen substitution was then performed, the lower hot plate was returned to room temperature, and the inside of the furnace was opened to the atmosphere. An appropriate amount of an underfill material (manufactured by Hitachi Chemical Co., Ltd., GEL series) with a viscosity adjusted was put between the evaluation chip and the evaluation substrate and filled therebetween by vacuuming, and then the material was cured at 125° C. for 3 hours to produce a connection structure between the evaluation chip and the evaluation substrate. Combinations of respective materials in the connection structure are as described below.

(8) Chip C8/Solder bump forming film 25/Substrate D8
(9) Chip C9/Solder bump forming film 26/Substrate D9
(10) Chip C10/Solder bump forming film 27/Substrate D10
(11) Chip C11/Solder bump forming film 28/Substrate D11
(12) Chip C12/Solder bump forming film 29/Substrate D12
(13) Chip C13/Solder bump forming film 30/Substrate D13

<Evaluation of Connection Structure>

For a part of the obtained connection structure, a conductive resistance test and an insulation resistance test were performed in the same manner as described above. Results are shown in Tables 10 to 12.

TABLE 10

| | | Connection structure | Solder bump forming film | Production Example 25 | Production Example 26 | Production Example 27 | Production Example 28 | Production Example 29 | Production Example 30 |
|---|---|---|---|---|---|---|---|---|---|
| Conductive resistance | Moisture absorption and heat resistance test | (8) | Initial | A | | | | | |
| | | | After 100 hours | A | | | | | |
| | | | After 500 hours | A | | | | | |
| | | | After 1000 hours | B | | | | | |
| | | (9) | Initial | | A | | | | |
| | | | After 100 hours | | A | | | | |
| | | | After 500 hours | | B | | | | |
| | | | After 1000 hours | | B | | | | |
| | | (10) | Initial | | | A | | | |
| | | | After 100 hours | | | A | | | |
| | | | After 500 hours | | | A | | | |
| | | | After 1000 hours | | | B | | | |
| | | (11) | Initial | | | | A | | |
| | | | After 100 hours | | | | A | | |
| | | | After 500 hours | | | | A | | |
| | | | After 1000 hours | | | | B | | |
| | | (12) | Initial | | | | | A | |
| | | | After 100 hours | | | | | A | |
| | | | After 500 hours | | | | | A | |
| | | | After 1000 hours | | | | | B | |
| | | (13) | Initial | | | | | | A |
| | | | After 100 hours | | | | | | A |
| | | | After 500 hours | | | | | | A |
| | | | After 1000 hours | | | | | | B |

TABLE 11

| | | Connection structure | Solder bump forming film | Production Example 25 | Production Example 27 | Production Example 30 |
|---|---|---|---|---|---|---|
| Conductive resistance | High-temperature exposure test | (8) | Initial | A | | |
| | | | After 100 hours | A | | |
| | | | After 500 hours | A | | |
| | | | After 1000 hours | B | | |
| | | (10) | Initial | | A | |
| | | | After 100 hours | | A | |
| | | | After 500 hours | | A | |
| | | | After 1000 hours | | B | |
| | | (13) | Initial | | | A |
| | | | After 100 hours | | | A |
| | | | After 500 hours | | | A |
| | | | After 1000 hours | | | B |

TABLE 12

| Connection structure | | Solder bump forming film | Production Example 25 | Production Example 26 | Production Example 27 | Production Example 28 | Production Example 29 | Production Example 30 |
|---|---|---|---|---|---|---|---|---|
| Insulation resistance | Moisture absorption and heat resistance test | (8) Initial | A | | | | | |
| | | After 100 hours | A | | | | | |
| | | After 500 hours | A | | | | | |
| | | After 1000 hours | B | | | | | |
| | | (9) Initial | | A | | | | |
| | | After 100 hours | | A | | | | |
| | | After 500 hours | | A | | | | |
| | | After 1000 hours | | B | | | | |
| | | (10) Initial | | | A | | | |
| | | After 100 hours | | | A | | | |
| | | After 500 hours | | | A | | | |
| | | After 1000 hours | | | A | | | |
| | | (11) Initial | | | | A | | |
| | | After 100 hours | | | | A | | |
| | | After 500 hours | | | | A | | |
| | | After 1000 hours | | | | A | | |
| | | (12) Initial | | | | | A | |
| | | After 100 hours | | | | | A | |
| | | After 500 hours | | | | | A | |
| | | After 1000 hours | | | | | A | |
| | | (13) Initial | | | | | | A |
| | | After 100 hours | | | | | | A |
| | | After 500 hours | | | | | | A |
| | | After 1000 hours | | | | | | A |

Production Examples 31 to 36

Evaluation Chips C8 to C13 shown in Table 9 on which solder bumps had been formed were obtained through the production of the base substrate of the step h1, the preparation of the evaluation chip of the step d2, and the solder hump formation of the step e2.

<Production of Connection Structure>

Six kinds of evaluation substrates provided with gold bumps (70×25 mm, thickness: 0.5 mm) described below were prepared. The gold bumps are disposed at positions corresponding to gold electrodes of Evaluation Chips C8 to C13 described above, and alignment marks are disposed on the substrates. Furthermore, lead-out wires for resistance measurement are formed on some of the gold bumps.

Substrate D8 area: 8 μm×4 μm, pitch: X direction 16 μm, direction 8 μm, height: 2 μm, number of bumps: 180000

Substrate D9 area: 16 μm×8 μm, pitch: X direction 32 μm, Y direction 16 μm, height: 3 μm, number of bumps: 46000

Substrate D10 area: 24×12 μm., pitch: X direction 48 μm, Y direction 24 μm, height: 3 μm, number of bumps: 15000

Substrate D11 area: 72 μm×36 μm, pitch: X direction 144 μm, Y direction 72 μm, height: 3 μm, number of bumps; 3400

Substrate D12 area: 96 μm×48 μm, pitch: X direction 192 μm, Y direction 96 μm, height: 3 μm, number of bumps: 850

Substrate D13 area: 140 μm×70 μm, pitch: X direction 280 μm, direction 140 μm, height: 3 μm, number of bumps: 420

Step g3: Bonding of Electrode

According to the following procedures i) to vi), the evaluation chip provided with solder bumps produced in the step e2 was used, and an evaluation substrate provided with gold bumps and the evaluation chip were connected to each other via solder bumps.

i) The evaluation substrate provided with gold bumps was set to a spin coater, and a liquid flux (NS-334, manufactured by ARAKAWA CHEMICAL INDUSTRIES, LTD.) was coated on the gold bump surface side.

ii) The evaluation substrate provided with gold bumps obtained in i) was placed on the stage of FC3000W (manufactured by Toray Engineering Co., Ltd.), the evaluation chip provided with solder bumps was picked up at the head, the gold electrodes faced each other using alignment marks on both of them, and the evaluation chip provided with solder bumps was disposed on the evaluation substrate provided with gold bumps to obtain pre-bonded samples 14 to 19.

iii) The pre-bonded sample was placed on a lower hot plate of a formic acid reflow furnace (manufactured by SHINKO SEIKI CO., LTD., batch-type: vacuum soldering device).

iv) A formic acid vacuum reflow furnace was operated, vacuuming was performed, nitrogen gas was then filled in the furnace, the lower hot plate was heated to 160° C., and heating was performed for 3 minutes. Thereafter, vacuuming was performed, nitrogen substitution was then performed, the lower hot plate was returned to room temperature, and the inside of the furnace was opened to the atmosphere.

v) The bonded sample was immersed in an isopropyl alcohol solution to wash out the flux residue.

vi) An appropriate amount of an underfill material (manufactured by Hitachi Chemical Co., Ltd., CEL series) with a viscosity adjusted was put between the evaluation Chip and the evaluation substrate and filled therebetween by vacuuming, and then the material was cured at 125° C. for 3 hours to produce a connection structure between the evaluation chip and the evaluation substrate. Combinations of respective materials in the connection structure are as described below.

(14) Chip C8/Solder bump forming film 25/Substrate D8
(15) Chip C9/Solder bump forming film 26/Substrate D9
(16) Chip C10/Solder bump forming film 27/Substrate D10
(17) Chip C11/Solder bump forming film 28/Substrate D11
(18) Chip C12/Solder bump forming film 29/Substrate D12
(19) Chip C13/Solder bump forming film 30/Substrate D13

<Evaluation of Connection Structure>

For a part of the obtained connection structure, a conductive resistance test and an insulation resistance test were performed in the same manner as described above. Results are shown in Tables 13 to 15.

TABLE 13

| | | Connection structure | Solder bump forming film | Production Example 31 | Production Example 32 | Production Example 33 | Production Example 34 | Production Example 35 | Production Example 36 |
|---|---|---|---|---|---|---|---|---|---|
| Conductive resistance | Moisture absorption and heat resistance test | (14) | Initial | A | | | | | |
| | | | After 100 hours | A | | | | | |
| | | | After 500 hours | A | | | | | |
| | | | After 1000 hours | B | | | | | |
| | | (15) | Initial | | A | | | | |
| | | | After 100 hours | | A | | | | |
| | | | After 500 hours | | B | | | | |
| | | | After 1000 hours | | B | | | | |
| | | (16) | Initial | | | A | | | |
| | | | After 100 hours | | | A | | | |
| | | | After 500 hours | | | A | | | |
| | | | After 1000 hours | | | B | | | |
| | | (17) | Initial | | | | A | | |
| | | | After 100 hours | | | | A | | |
| | | | After 500 hours | | | | A | | |
| | | | After 1000 hours | | | | B | | |
| | | (18) | Initial | | | | | A | |
| | | | After 100 hours | | | | | A | |
| | | | After 500 hours | | | | | A | |
| | | | After 1000 hours | | | | | B | |
| | | (19) | Initial | | | | | | A |
| | | | After 100 hours | | | | | | A |
| | | | After 500 hours | | | | | | A |
| | | | After 1000 hours | | | | | | B |

TABLE 14

| | | Connection structure | Solder bump forming film | Production Example 31 | Production Example 33 | Production Example 36 |
|---|---|---|---|---|---|---|
| Conductive resistance | High-temperature exposure test | (14) | Initial | A | | |
| | | | After 100 hours | A | | |
| | | | After 500 hours | A | | |
| | | | After 1000 hours | B | | |
| | | (16) | Initial | | A | |
| | | | After 100 hours | | A | |
| | | | After 500 hours | | A | |
| | | | After 1000 hours | | B | |
| | | (19) | Initial | | | A |
| | | | After 100 hours | | | A |
| | | | After 500 hours | | | A |
| | | | After 1000 hours | | | B |

TABLE 15

| | | Connection structure | Solder bump forming film | Production Example 31 | Production Example 32 | Production Example 33 | Production Example 34 | Production Example 35 | Production Example 36 |
|---|---|---|---|---|---|---|---|---|---|
| Insulation resistance | Moisture absorption and heat resistance test | (14) | Initial | A | | | | | |
| | | | After 100 hours | A | | | | | |
| | | | After 500 hours | A | | | | | |
| | | | After 1000 hours | B | | | | | |
| | | (15) | Initial | | A | | | | |
| | | | After 100 hours | | A | | | | |
| | | | After 500 hours | | A | | | | |
| | | | After 1000 hours | | B | | | | |

TABLE 15-continued

| Connection structure | Solder bump forming film | Production Example 31 | Production Example 32 | Production Example 33 | Production Example 34 | Production Example 35 | Production Example 36 |
|---|---|---|---|---|---|---|---|
| (16) | Initial | | | A | | | |
|  | After 100 hours | | | A | | | |
|  | After 500 hours | | | A | | | |
|  | After 1000 hours | | | A | | | |
| (17) | Initial | | | | A | | |
|  | After 100 hours | | | | A | | |
|  | After 500 hours | | | | A | | |
|  | After 1000 hours | | | | A | | |
| (18) | Initial | | | | | A | |
|  | After 100 hours | | | | | A | |
|  | After 500 hours | | | | | A | |
|  | After 1000 hours | | | | | A | |
| (19) | Initial | | | | | | A |
|  | After 100 hours | | | | | | A |
|  | After 500 hours | | | | | | A |
|  | After 1000 hours | | | | | | A |

REFERENCE SIGNS LIST

1: solder particle, 1A: solder bump, 1B: solder layer, 2: substrate, 3: electrode, 4: another substrate, 5: another electrode, 10: solder bump forming member, 20: electrode substrate provided with solder bumps. 30: connection structure, 60: base substrate, 62: recess, 111: solder fine particle, 600: base substrate. 601: base layer, 602: recess layer.

The invention claimed is:

1. A solder bump forming member comprising:
a base substrate having a plurality of recesses; and
a plurality of solder particles in the recesses, respectively, wherein;
each of the solder particles has an average particle diameter of 1 to 35 μm and a C.V value of 20% or less;
a part of each of the solder particles projects from the respective recess; and
each of the solder particles includes a planar portion in contact with a bottom portion of the respective recess.

2. A solder bump forming member comprising:
a base substrate having a plurality of recesses; and
a plurality of solder particles in the recesses, wherein:
each of the solder particles has an average particle diameter of 1 to 35 μm and a C.V value of 20% or less;
in cross-sectional view, when a depth of each of the recesses is designated as $H_1$, and a height of the solder particle is designated as $H_2$, $H_1 < H_2$ is established; and
each of the solder particles includes a planar portion in contact with a bottom portion of the respective recess.

3. The solder bump forming member according to claim 1, wherein a distance between the recesses adjacent to each other is 0.1 times or more the average particle diameter of the solder particle.

4. The solder bump forming member according to claim 1, wherein a ratio (A/B) of a diameter (A) of the planar portion to a diameter (B) of each of the solder particles is greater than 0.01 and less than 1.0.

5. The solder bump forming member according to claim 1, wherein a ratio (A/B) of a diameter (A) of the planar portion to a diameter (B) of each of the solder particles is equal to or greater than 0.1 and equal to or less than 0.9.

6. The solder bump forming member according to claim 1, wherein at least one alignment mark is provided on the base substrate to permit accurate transfer of the solder particles onto a base substrate having an electrode.

7. The solder bump forming member according to claim 1, wherein each of the recesses has a depth $H_1$, and each of the solder particles has a height $H_2$, and a ratio of $H_2/H_1$ is 1.02 to 3.00.

8. The solder bump forming member according to claim 1, wherein the base substrate includes a base layer and a recess layer in which the recesses are formed, wherein the base layer supports the recess layer.

* * * * *